(12) United States Patent
Wang et al.

(10) Patent No.: US 9,176,206 B2
(45) Date of Patent: Nov. 3, 2015

(54) EFFECTIVE-INDUCTANCE-CHANGE BASED MAGNETIC PARTICLE SENSING

(75) Inventors: Hua Wang, Pasadena, CA (US); Seyed Ali Hajimiri, Pasadena, CA (US); Yan Chen, Pasadena, CA (US)

(73) Assignee: California Institute of Technology, Pasadena, CA (US)

( * ) Notice: Subject to any disclaimer, the term of this patent is extended or adjusted under 35 U.S.C. 154(b) by 381 days.

(21) Appl. No.: 12/399,603

(22) Filed: Mar. 6, 2009

(65) Prior Publication Data

US 2009/0267596 A1    Oct. 29, 2009

Related U.S. Application Data

(60) Provisional application No. 61/068,513, filed on Mar. 7, 2008.

(51) Int. Cl.
    *G01N 27/00*      (2006.01)
    *G01N 33/00*      (2006.01)
    *G01R 33/12*      (2006.01)

(52) U.S. Cl.
    CPC .................................. *G01R 33/1269* (2013.01)

(58) Field of Classification Search
    USPC ............... 73/861.11; 324/207.22; 436/86, 94, 436/149, 151, 525–526, 806
    See application file for complete search history.

(56) References Cited

U.S. PATENT DOCUMENTS

| | | | | |
|---|---|---|---|---|
| 3,641,461 A | * | 2/1972 | Mrozek | 331/116 R |
| 3,676,772 A | * | 7/1972 | Lee | 324/233 |
| 4,497,998 A | | 2/1985 | West | |
| 4,719,384 A | | 1/1988 | Hauden et al. | |
| 4,837,511 A | * | 6/1989 | Whittington et al. | 324/236 |

(Continued)

FOREIGN PATENT DOCUMENTS

| | | |
|---|---|---|
| EP | 1146347 | 10/2001 |
| JP | 2002005892 | 1/2001 |

(Continued)

OTHER PUBLICATIONS

Wang, H. et al, IEEE International Solid-State Circuits Conference—Digest of Technical Papers Feb. 2009, 438-439 and 439a.*

(Continued)

*Primary Examiner* — Arlen Soderquist
(74) *Attorney, Agent, or Firm* — Knobbe, Martens, Olson & Bear, LLP

(57) ABSTRACT

The invention relates to an integrated measurement system to detect a quantity of magnetic particles in a sample. The measurement system includes a substrate. An electromagnetic (EM) structure disposed on the surface of the substrate is configured to receive a sample including the magnetic particles in proximity thereof. The integrated measurement system also includes an electrical current generator disposed on the surface of the substrate which is electro-magnetically coupled to the EM structure. The electrical current generator is configured to cause an electrical current to flow in the EM structure. The integrated measurement system also includes an effective inductance sensor disposed on the surface of the substrate which is configured to measure a selected one of an effective inductance and a change in effective inductance. The invention also relates to a method to determine the number of and/or the locations of the magnetic particles in a sample.

20 Claims, 22 Drawing Sheets

(56) References Cited

U.S. PATENT DOCUMENTS

| | | | |
|---|---|---|---|
| 4,878,019 A * | 10/1989 | Tsaprazis et al. | 324/204 |
| 4,932,255 A | 6/1990 | Brace et al. | |
| 5,001,424 A * | 3/1991 | Kellett et al. | 324/204 |
| 5,334,932 A * | 8/1994 | Nielsen | 324/204 |
| 5,341,112 A * | 8/1994 | Haman | 331/116 R |
| 5,354,967 A | 10/1994 | Barzilai et al. | |
| 5,369,245 A | 11/1994 | Pickering | |
| 5,608,315 A * | 3/1997 | Crayton et al. | 324/204 |
| 5,655,665 A * | 8/1997 | Allen et al. | 209/223.1 |
| 5,670,886 A * | 9/1997 | Wolff et al. | 324/644 |
| 5,818,097 A | 10/1998 | Rohlfing et al. | |
| 5,831,331 A | 11/1998 | Lee | |
| 5,922,537 A * | 7/1999 | Ewart et al. | 435/6.11 |
| 5,981,297 A * | 11/1999 | Baselt | 436/514 |
| 6,049,157 A | 4/2000 | Kobayashi | |
| 6,052,080 A | 4/2000 | Magori | |
| 6,078,208 A | 6/2000 | Nolan et al. | |
| 6,084,399 A * | 7/2000 | Nagaishi et al. | 324/204 |
| 6,110,660 A * | 8/2000 | Kriz et al. | 435/4 |
| 6,127,661 A | 10/2000 | Fry | |
| 6,229,307 B1 * | 5/2001 | Umehara et al. | 324/249 |
| 6,322,963 B1 * | 11/2001 | Bauer | 435/4 |
| 6,359,444 B1 * | 3/2002 | Grimes | 324/633 |
| 6,377,130 B1 * | 4/2002 | Haman | 331/176 |
| 6,777,244 B2 * | 8/2004 | Pepper et al. | 436/165 |
| 6,819,120 B2 * | 11/2004 | Tam | 324/633 |
| 7,081,806 B2 | 7/2006 | Koike | |
| 7,102,453 B1 * | 9/2006 | Rohde et al. | 331/117 R |
| 7,241,630 B2 * | 7/2007 | Hawkins et al. | 436/526 |
| 7,486,168 B2 | 2/2009 | Kim | |
| 7,557,566 B2 * | 7/2009 | Kordonski et al. | 324/204 |
| 7,808,358 B2 | 10/2010 | Nakamura et al. | |
| 7,888,929 B2 * | 2/2011 | Kordonski et al. | 324/204 |
| 7,951,582 B2 * | 5/2011 | Gazit et al. | 435/287.1 |
| 8,026,716 B2 * | 9/2011 | Makiranta et al. | 324/207.25 |
| 8,274,021 B2 | 9/2012 | Wang et al. | |
| 8,378,699 B2 | 2/2013 | Stott et al. | |
| 2001/0050555 A1 * | 12/2001 | Hawkins et al. | 324/204 |
| 2002/0048534 A1 * | 4/2002 | Storek et al. | 422/99 |
| 2003/0012693 A1 * | 1/2003 | Otillar et al. | 422/58 |
| 2003/0027197 A1 * | 2/2003 | Nikitin et al. | 435/6 |
| 2003/0169032 A1 * | 9/2003 | Minchole et al. | 324/204 |
| 2004/0100277 A1 * | 5/2004 | Tam | 324/633 |
| 2004/0171172 A1 * | 9/2004 | Laitinen et al. | 436/514 |
| 2005/0079598 A1 * | 4/2005 | Davis | 435/287.1 |
| 2005/0275497 A1 * | 12/2005 | Ramadan et al. | 336/200 |
| 2006/0006884 A1 * | 1/2006 | Yamada et al. | 324/724 |
| 2006/0020371 A1 * | 1/2006 | Ham et al. | 700/266 |
| 2007/0007486 A1 * | 1/2007 | Gleich et al. | 252/62.58 |
| 2007/0172890 A1 * | 7/2007 | Prins et al. | 435/7.1 |
| 2007/0197900 A1 * | 8/2007 | Baudenbacher et al. | 600/409 |
| 2008/0024117 A1 * | 1/2008 | Hong et al. | 324/201 |
| 2008/0214092 A1 * | 9/2008 | Kordonski et al. | 451/36 |
| 2008/0258721 A1 | 10/2008 | Guo et al. | |
| 2008/0309329 A1 | 12/2008 | Kahlman et al. | |
| 2009/0029407 A1 * | 1/2009 | Gazit et al. | 435/30 |
| 2009/0237844 A1 * | 9/2009 | Duric et al. | 360/324 |
| 2009/0243603 A1 * | 10/2009 | Makiranta et al. | 324/225 |
| 2010/0134097 A1 * | 6/2010 | Wang et al. | 324/228 |
| 2011/0175602 A1 * | 7/2011 | Wang et al. | 324/239 |

FOREIGN PATENT DOCUMENTS

| | | |
|---|---|---|
| WO | 2005099419 A2 | 10/2005 |
| WO | 2007122293 A1 | 11/2007 |
| WO | 2007132374 A1 | 11/2007 |

OTHER PUBLICATIONS

Choi J-W et al: "A new magnetic bead-based, filterless bioseparator with planar electromagnet surfaces for integrated biodetection systems", Sensors and Actuators B: Chemical: International Journal Devoted to Research and Development of Physical and Chemical Transducers, Elsevier S. A, Switzerland, vol. 68, No. 1-3, Aug. 25, 2000, pp. 34-39.

Ramadan Q et al: "An integrated microfluidic platform for magnetic microbeads separation and confinement", Biosensors and Bioelectronics, Elsevier BV, NL, vol. 21, No. 9, Mar. 15, 2006, pp. 1693-1702.

Shu-Jen Han et al: "A High-Density Magnetoresistive Biosensor Array with Drift-Compensation Mechanism", 2007 IEEE International Solid-State Circuits Conference (IEEE Cat. No. 07CH37858), IEEE, Piscataway, NJ, USA, Feb. 1, 2007, pp. 168-169, 594.

Kiely J et al: "Paramagnetic particle detection for use with an immunoassay based biosensor", IET Sci. Meas. Technol. vol. 1, No. 5, Sep. 6, 2007, pp. 270-275.

Florescu Octavian et al: "Fully integrated detection of single magnetic beads in complementary metal-oxide semiconductor", Journal of Applied Physics, American Institute of Physics. New York, US, vol. 103, No. 4, Feb. 19, 2008, pp. 46101-46101.

S. Tanaka, et al., "A DNA Detection System Based Upon a High Tc SQUID and Ultra-Small Magnetic Particles", *IEEE Transaction on Applied Superconductivity*, vol. 15, No. 2, Jun. 2005, pp. 664-667.

G. Li, et al., "Model and Experiment of Detecting Multiple Magnetic Nanoparticles as Biomolecular Labels by Spin Valve Sensors", *IEEE Transactions on Magnetics*, vol. 40, No. 4, pp. 3000-3002, Jul. 2004.

G.A. Gibson, et al., "Magnetic force microscope study of the micromagnetics of submicrometer magnetic particles", Journal of Applied Physics, vol. 73, issue 9, pp. 4516-4521, Jan. 1993.

T. Aytur, "An Immunoassay Platform Based on CMOS Hall Sensors", *Solid-State Sensor, Actuator and Microsystems Workshop*, Jun. 2002, 4 pages.

P.A. Besse, et al., "Detection of a single magnetic microbead using a miniaturized silicon Hall sensor", *Applied Physics Letters*, vol. 80, No. 22, pp. 4199-4201, Jun. 3, 2002.

D.R. Baselt, et al., "A Biosensor based on magnetoresistance Technology", *Biosensor and Bioelectronics*, vol. 13, Issue 7-8, pp. 731-739, Oct. 1998.

Invitrogen Online Catalog as of Jul. 1, 2007 (retrieved via http://web.archive.org/web/20070701103739/https://catalog.invitrogen.com/index.cfm?fuseaction=userCountry.selectCountry&returnURL=https%3A%2F%2Fcatalog%2Einvitrogen%2Ecom%2Findex%2-Ecfm%3F on May 19, 2015).

Invitrogen Corporation, Custom Products and Services, Reliability, Quality, Partnership, Invitrogen custom turnkey solutions, 2006, pp. 1-22, (retrieved viahttps://tools.lifetechnologies.com/downloads/B-065997_Services-brochure.pdf on May 19, 2015).

* cited by examiner

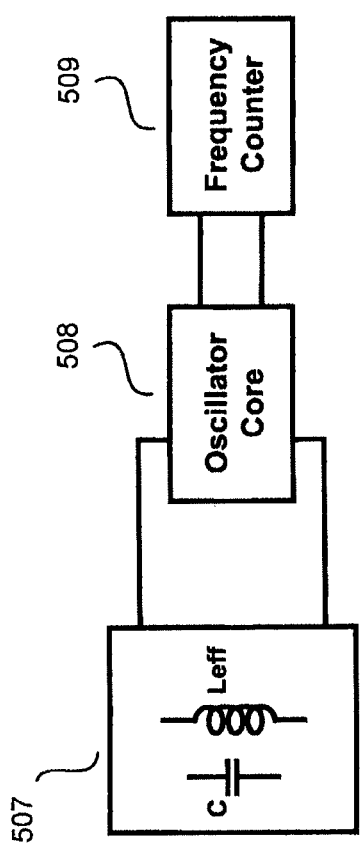
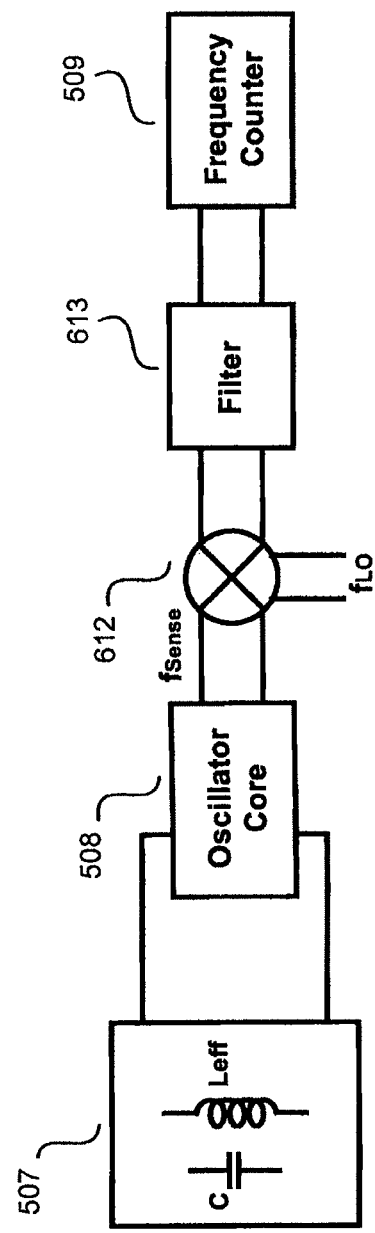

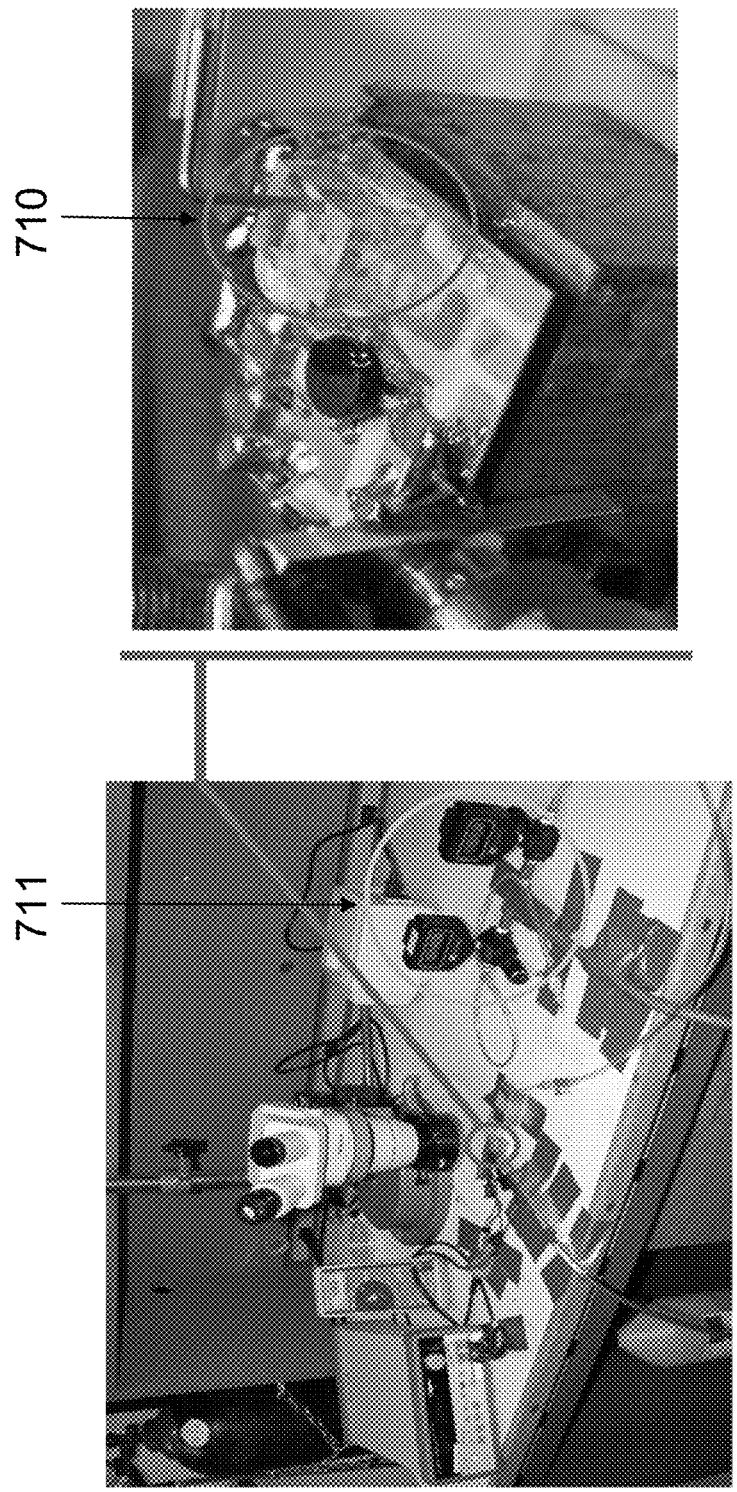

EFFECTIVE-INDUCTANCE-CHANGE BASED MAGNETIC PARTICLE SENSING

CROSS-REFERENCE TO RELATED APPLICATIONS

This application claims priority to and the benefit of U.S. provisional patent application Ser. No. 61/068,513, filed Mar. 7, 2008, which application is incorporated herein by reference in its entirety.

STATEMENT REGARDING FEDERALLY FUNDED RESEARCH OR DEVELOPMENT

The U.S. Government has certain rights in this invention pursuant to Grant No. N00014-04-C-0588 awarded by ONR—Space and Naval Warfare Systems Center.

FIELD OF THE INVENTION

The invention relates in general to bio-sensors and more particularly to micro/nano bead based cell/bio-molecule sensors.

BACKGROUND OF THE INVENTION

Non-optical methods for bioassay are of interest to the interdisciplinary fields of biology, applied physics, and microelectronics. Magnetic micro/nano beads have been studied for use in cell/bio-molecule sensing as one non-optical method. While the magnetic behavior of magnetic micro/nano beads can be detected without using costly imaging systems, sensing magnetic micro/nano particles remains a challenging task. Various detection methods have been proposed to address this sensing challenge. Traditionally, superconducting quantum interference devices (SQUIDs), giant magnetoresistance (GMR) arrays and atomic force microscopy have been used for their high sensitivity. However, sensing methods such as those based on SQUIDs or GMR arrays typically cannot be fabricated with standard integrated processes as CMOS. Also, both SQUID and GMR array generally require relatively costly postprocessing steps. Moreover, GMR techniques need externally generated biasing magnetic fields. Such biasing magnetic fields can be provided using either permanent or electro-magnets, which leads to extra power-consumption, large form-factor and high cost. Moreover, the biasing magnetic fields need to be calibrated to set a correct orientation, which increases the difficulty of use.

Another prior art sensor technology, the Hall sensor, is available in CMOS processes. Hall sensors, however, need a relatively high power external biasing field, thus precluding most low power portable battery powered applications. The biasing magnetic fields also have all of the impediments mentioned before for GMR sensors. Hall sensor based systems are also generally unsuitable for use in micro-fluidic systems. For example, for optimum sensitivity, Hall sensors should have dimensions (sensor size and passivation layer thickness) on the order of the dimensions of the magnetic beads to be sensed. Such Hall dimensions typically limit the hall sensor to a small sensing area and preclude sensor compatibility over a range of sizes of magnetic particles of interest. Moreover, to achieve a close proximity between the Hall sensor sensing part and the magnetic samples, expensive post processes, such as etching, are needed.

Therefore, what is needed is a more efficient and flexible system and method for making micro/nano magnetic bead based cell/bio-molecule measurements.

SUMMARY OF THE INVENTION

In one aspect, the invention relates to an integrated measurement system to detect a quantity of magnetic particles in a sample. The measurement system includes a substrate having a surface. The integrated measurement system also includes an electromagnetic (EM) structure disposed on the surface of the substrate which is configured to receive a sample including the magnetic particles in proximity thereof. The integrated measurement system also includes an electrical current generator disposed on the surface of the substrate which is electro-magnetically coupled to the EM structure. The electrical current generator is configured to cause an electrical current to flow in the EM structure. The integrated measurement system also includes an effective inductance sensor which is disposed on the surface of the substrate and configured to measure a selected one of an effective inductance and a change in effective inductance; thereby to detect the quantity of magnetic particles.

In one embodiment, the magnetic particles include magnetic beads.

In another embodiment, the integrated measurement system comprises a CMOS structure.

In yet another embodiment, the electrical current generator comprises a quasi-static electrical current generator.

In yet another embodiment, the magnetic particles include magnetic micro/nano beads.

In yet another embodiment, the measurement system includes a cell/bio-molecule sensing system.

In yet another embodiment, the measurement system includes an impedance based sensing system.

In yet another embodiment, the measurement system includes a transmission line based sensing system.

In yet another embodiment, the measurement system includes an oscillator based sensing system.

In yet another embodiment, the oscillator based measurement further includes a mixer and wherein a difference frequency is measured to detect the quantity of magnetic particles.

In yet another embodiment, the oscillator based measurement includes a low noise oscillator.

In yet another embodiment, the integrated measurement system further includes a temperature regulator.

In yet another embodiment, the temperature regulator is configured to set a temperature of the integrated measurement system.

In yet another embodiment, the temperature regulator is configured to set a temperature of the quantity of magnetic particles in the sample.

In yet another embodiment, the measurement system further includes a sample delivery structure.

In yet another embodiment, the sample delivery structure includes a microfluidic delivery structure.

In yet another embodiment, the measurement system further includes a second EM structure disposed on the surface of the substrate, wherein the first EM structure is configured to receive a sample including a plurality of target particles and the second EM structure is configured to receive a control solution.

In yet another embodiment, the control solution includes a sample lacking magnetic particles.

In yet another embodiment, the control solution includes a sample having magnetic particles.

In yet another embodiment, the control solution includes a sample lacking magnetic properties.

In yet another embodiment, the control solution includes a sample having magnetic properties.

In yet another embodiment, the measurement system further includes a sensor configured to make a differential sensing measurement.

In yet another embodiment, an oscillator based measurement system includes a sensing oscillator and a reference oscillator configured to obtain a correlation on a 1/f3 phase noise and wherein the sensing oscillator and the reference oscillator are configured to measure a difference between a first set of frequency counts of the sensing oscillator and a second set of frequency counts of the reference oscillator.

In yet another embodiment, a differential sensing system is configured to suppress a common mode noise.

In yet another embodiment, the measurement system further includes an M×N array of EM structures disposed on the surface of the substrate, wherein each element of the array of EM structures is configured for a sensitivity to a particular type of target particle and the measurement system is configured to measure a plurality of quantities of the particular types target particles for each of a plurality of sample volumes, each sample volume of the plurality of sample volumes including a portion of a common sample.

In yet another embodiment, the measurement system further includes an M×N array of EM structures disposed on the surface of the substrate, wherein each element of the array of EM structures is configured to measure a quantity of target particles of a respective one of a plurality of different samples.

In another aspect, the invention relates to method for determining the number of magnetic particles in a sample including the steps of: providing an integrated magnetic particle sensor having a sensor sample volume, an electromagnetic (EM) structure, an electrical current generator, and an effective inductance sensor; providing a sample including a plurality of magnetic particles; delivering the sample to the sensor sample volume; generating an electrical current in the EM structure to establish a magnetic field in the sensor sample volume; measuring parameter of the sensor sample volume; and determining the number of magnetic particles in the sample based on the parameter.

In one embodiment, the step of measuring a parameter comprises the step of measuring an electrical parameter of said sensor sample volume and said step of determining the number of magnetic particles comprises the step of determining the number of magnetic particles in said sample based on said electrical parameter.

In another embodiment, the step of measuring a parameter comprises the step of measuring a magnetic parameter of said sensor sample volume and said step of determining the number of magnetic particles comprises the step of determining the number of magnetic particles in said sample based on said magnetic parameter.

In one embodiment, the step of providing an integrated magnetic particle sensor includes providing an impedance measurement based magnetic particle sensor having a sensor sample volume.

In another embodiment, the step of providing an integrated magnetic particle sensor includes providing a transmission line based magnetic particle sensor having a sensor sample volume.

In yet another embodiment, the step of providing an integrated magnetic particle sensor includes providing an oscillator based magnetic particle sensor having a sensor sample volume.

In yet another embodiment, the step of measuring an parameter includes measuring an parameter of said sensor sample volume by averaging a set of measurements to lower the noise floor and to improve a measurement sensitivity.

In yet another embodiment, averaging a set measurements includes averaging a set of frequency counting measurements.

In yet another embodiment, the method further comprises the following additional steps: generating an electrical current in said EM structure to establish a magnetic field in a sensor sample volume lacking a sample; measuring a parameter of said sensor sample volume lacking a sample; determining an empty sensor sample volume measurement based on said parameter; and determining the number of magnetic particles in said sample based on said parameter of said empty sensor volume and said sensor volume having a delivered sample.

In yet another aspect, the invention relates to an integrated measurement system to detect a location of magnetic particles in a sample. The measurement system includes a substrate having a surface. The integrated measurement system also includes an electromagnetic (EM) structure disposed on the surface of the substrate which is configured to receive a sample including the magnetic particles in proximity thereof. The integrated measurement system also includes an electrical current generator disposed on the surface of the substrate which is electro-magnetically coupled to the EM structure. The electrical current generator is configured to cause an electrical current to flow in the EM structure. The integrated measurement system also includes an effective inductance sensor which is disposed on the surface of the substrate and configured to measure a selected one of an effective inductance and a change in effective inductance; thereby to detect the location of magnetic particles.

BRIEF DESCRIPTION OF THE DRAWINGS

The objects and features of the invention can be better understood with reference to the drawings described below, and the claims. The drawings are not necessarily to scale, emphasis instead generally being placed upon illustrating the principles of the invention. In the drawings, like numerals are used to indicate like parts throughout the various views.

FIG. 5 shows one embodiment of a micro/nano magnetic particle detection system using an inductance sensor based on an oscillator.

FIG. 6 shows one embodiment of an improved oscillator based sensor.

FIG. 19A shows an illustration of an overall experimental sensor setup.

FIG. 19B shows an illustration emphasizing the sensor of FIG. 19A.

DETAILED DESCRIPTION OF THE INVENTION

Figure 1:
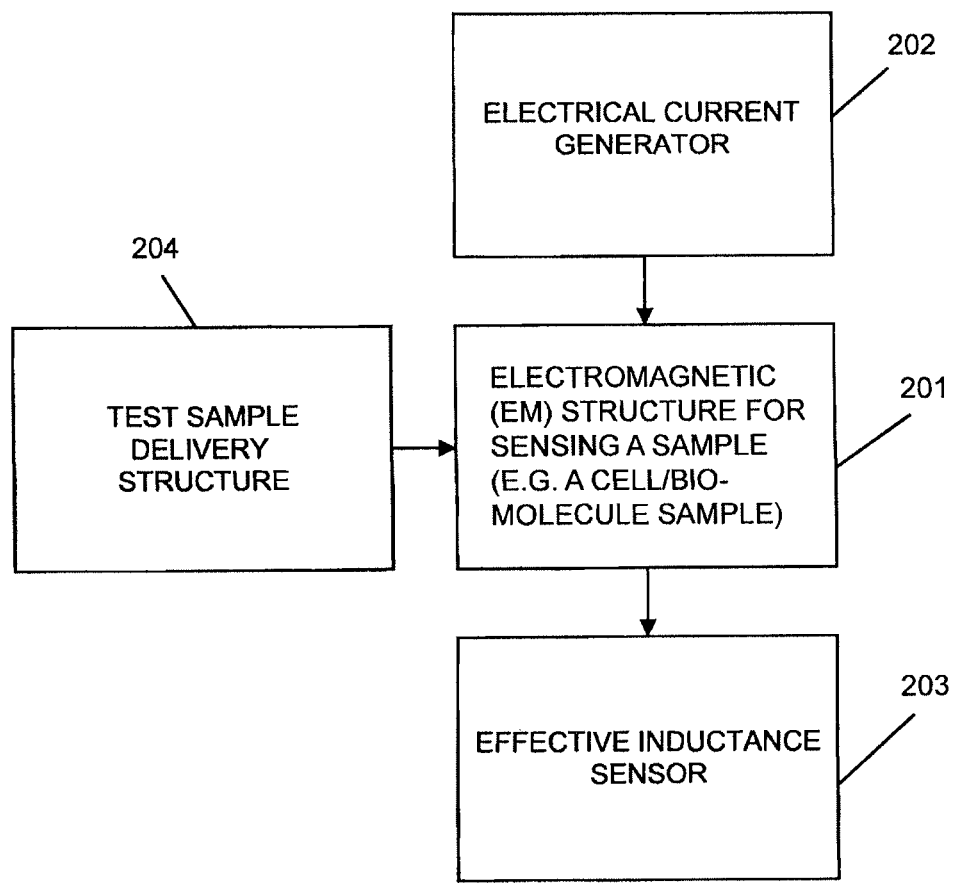
FIG. 1 shows a block diagram of one embodiment of a general form of a magnetic particle detection system.

The description which follows is organized into four sections. Part I generally introduces the inventive sensor system. Part II describes the inventive method using a flow diagram. Part III describes three embodiments of a micro/nano magnetic particle detection system, an impedance based sensor, a transmission line based sensor, and an oscillator based sensor. Part IV describes several exemplary implementations of the sensor system including arrays and two implementation examples. Theoretical underpinnings are described for the sensing methods, and for an approximate close-form solution to quantify the inductance change in the magnetic particle sensors described herein.

Part I, Introduction

Bio-systems, on their own, typically do not generate significant magnetic signals. Therefore, cell/bio-molecule sensing systems, and methods, using magnetic bead based sensors (e.g. to detect magnetic micro/nano beads) offer several advantages for magnetic detection based cell/bio-molecule measurements, including a relatively quiet sensing background. Fluorescent label optical techniques offer a widely used alternative cell/bio-molecule measurement technology. However, as compared with fluorescent label optical techniques, magnetic beads do not exhibit signal quenching or decaying problems. Magnetic bead-based measurements are largely immune to such problems since their characteristic signal typically exhibits a stable relationship with respect to external excitation for a long measurement time. The stable nature of magnetic bead-based measurement signals also lends itself to filtering techniques that can provide an improved signal to noise ratio (SNR) by signal averaging.

Another advantage is the ability of magnetic beads to manipulate attached cells/macromolecules. The ability to manipulate attached cells/macromolecules can lead to several desirable features including, bio-sample delivery, concentration/separation, and affinity binding facilitation both with and without valve/channel based conventional micro-fluidic systems. Also, micro/nano magnetic beads can be engineered to be biocompatible and can be made available for most commonly used bio-probe coatings. Therefore, micro/nano magnetic beads are particularly well suited for bio sensing platforms.

As described above, the design of efficient and flexible systems and methods for sensing magnetic micro/nano particles remains a challenging task. The challenge is due in part to their magnetic property (superparamagnetic for most of the off-the-shelf magnetic micro/nano particles) which offers a relatively low effective relative permeability value ($\mu_r$). Such a low $\mu_r$, typically around 2 to 3, can lead to small magnetic measurement signals. Traditional magnetic toroid shapes are generally not suitable for use with planar sensors, where magnetic excitation/sensing is generally carried out in an open-magnetic-loop fashion. Also, demagnetization effects can further degrade the sensitivity.

In some of the embodiments of micro/nano magnetic particle detection systems and methods described herein, the magnetic material properties of micro/nano magnetic particles are used to measure an effective inductance change of a sensor structure. The sensor structure can be viewed as an optimized electromagnetic (EM) structure. In contrast with prior art methods, the inventive structures described herein are generally compatible with standard integrated circuit processes, i.e. free of any external biasing magnetic field setups, capable of being adapted for magnetic manipulation, and providing a relatively large sensing area which can accommodate magnetic particles of virtually any size. Sensors as described herein-below can be made fully portable and battery-powered and can be better integrated with sample delivery structures, such as micro-fluidic systems. Such sensors systems can also be fabricated as a hybrid lab-on-chip (LOC) for point-of-care (POC) medical diagnostic support applications. Such sensor systems can also be used for parallel sensing for many same/different samples in an array fashion. The sensor schemes described herein can be implemented in planar format, and are therefore compatible with standard integrated circuit processes.

Part II, General Description of the New Sensor

In this section, a new class of sensors that uses a new detection method for sensing magnetic particles is described. Various embodiments of these sensors generally include the following functional blocks:

1) One or more electromagnetic (EM) structures for sensing a cell/bio-molecule sample;

2) One or more circuits that can generate an electrical current conducting through the EM structures of block 1;

3) One or more circuits to sense the effective inductance and/or a change in effective inductance; and optionally;

4) A structure to deliver the test samples to the one or more optimized electromagnetic (EM) structures.

FIG. 1 shows a block diagram of one embodiment of a general form of a magnetic particle detection system as described above. An electromagnetic (EM) structure for sensing a cell/bio-molecule sample is configured to evaluate a sample volume in or near the EM structure 201. EM structure 201 can operate without a sample, or with a sample having insignificant magnetic properties, or with certain magnetic properties such as control samples, to make control measurements. EM structure 201 can also operate to evaluate a sample having magnetic particles such as bio-molecules and cells having attached magnetic particles. A sample can be manually placed in, or in the vicinity of the EM structure for a measurement of the sample. More typically, a test sample delivery structure 204 can be used to deliver a sample for measurement to a sample volume, such as by use of a liquid or suspended liquid. An electrical current generator 202 generates an electrical current flow through the sensing EM structure 201. An effective inductance sensor 203 measures an effective inductance, or a change in effective inductance, such as a change in effective inductance from an empty sample volume to a sample volume occupied by a sample with magnetic particles.

The electrical current generator 202 can also be a quasi-static current generator. A quasi-static current generator can generate a DC (direct current) and/or one or more AC currents (alternating electrical currents). If an AC current is generated, the frequency of the AC current should be low enough, so that the dimension of the circuits and/or the EM structure where this AC current will flow through will be much smaller than the electromagnetic wavelength at this frequency in a media in which the circuit and/or the EM structure is placed.

As described in more detail below, the various functional blocks (201, 202, and 203) need not necessarily be implemented as separate structural blocks. For example, in some embodiments, a given structural block can include both the functions of blocks 201 and 202 simultaneously. Also, note that the electrical current conducting through the EM structures can be described interchangeably as a current, or as a voltage or power level that causes the current.

The working mechanism is described as follows: First, a sample is delivered onto the sensor through the delivery structure. Magnetic particles can be included directly in the sample where the magnetic particles are the sensing target. Micro- or nano-meter level non-magnetic particles, such as bio-molecules and cells, can also be attached with magnetic particles to serve as a target sample. In this case, detecting the presence of magnetic particles infers the existence of target nonmagnetic particles. Samples with no magnetic particles can also be used to characterize sensor response in a control case. Next, the current generation circuitry generates an electrical current which is conducted through the EM structure. Based on the strength of the current and the shape of the EM structure, a magnetic field is established throughout a sample space where a target sample or control sample can also be present. The magnetic field polarizes magnetic particles present in the space and induces magnetization of the particles, which increases the total magnetic energy in the space. The total number of magnetic particles and their locations present in a sample volume determines the total magnetic energy change, which is related to the effective inductance (both/either self and/or mutual inductance) change of the EM structure. Theoretical details are presented hereinbelow. Then the inductance sensing circuit measures the inductance (both/either self and/or mutual inductance) value and/or its change for the EM structure, which infers the presence and the number of magnetic particles and their location information present in a sample. Since the EM structure can be designed with a location-dependent sensitivity, the sensor systems described herein can also sense information related to the location and distribution of the magnetic particles.

Figure 2:
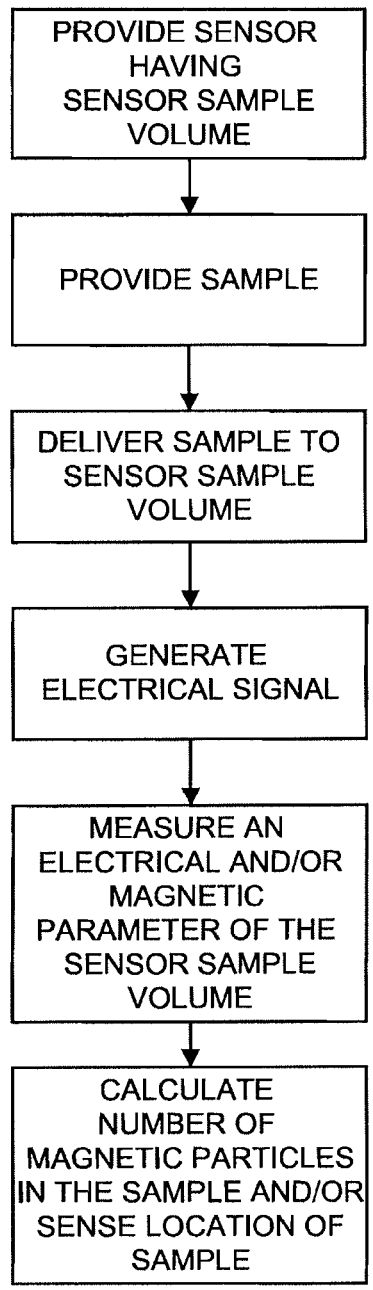
FIG. 2 shows a flow chart of one exemplary method for magnetic particle sensing.

The flow diagram of FIG. 2 shows one embodiment of the inventive method. The method shown in FIG. 2 can determine the number of magnetic particles in a sample by following the steps of: providing a magnetic particle sensor having a sensor sample volume; providing an electromagnetic (EM) generating structure; providing a sample comprising a plurality of magnetic particles; delivering the sample to the sensor sample volume; generating an electrical current in the electromagnetic generating structure to establish a magnetic field in the sensor sample volume; measuring a magnetic and/or electrical parameter of the sensor sample volume, typically effective inductance or a change in effective inductance; and determining the number of magnetic particles in the sample based on the magnetic and/or electrical parameter.

A baseline measurement of the sensor response can be made before delivering the samples (e.g. after cleaning and/or washing away samples) by measuring some specific control samples (magnetic or non-magnetic), and/or by measuring a reference sensor. The signals measured, for example for the samples, can be processed with the baseline measurement(s), e.g. by addition or subtraction, to yield the desired information.

Part III, Three Embodiments of a Magnetic Particle Detection System

Part III describes three embodiments of a micro/nano magnetic particle detection system, including as alternatives an impedance based sensor, a transmission line based sensor, and an oscillator based sensor. The functional blocks described as a general structure in Part II do not necessarily correspond one-to-one with structural block of each embodiment described in this section. For example, in some embodiments, one structural block can perform shared functions. For each embodiment, a correlation is given to the general embodiment described in Part II and illustrated by the block diagram of FIG. 1.

Impedance Measurement Based Sensor

Figure 3:
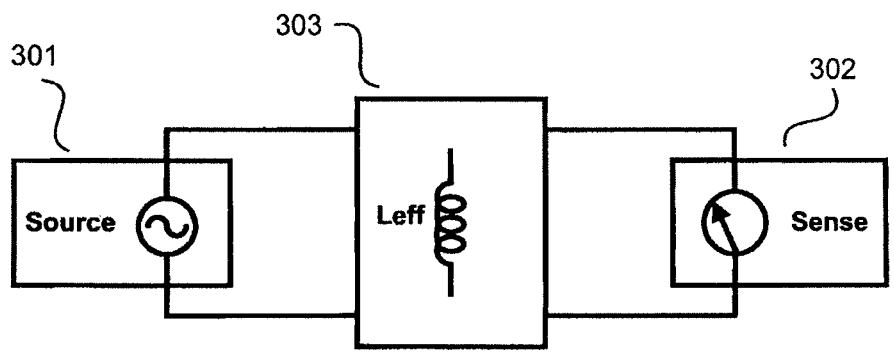
FIG. 3 shows a block diagram of one exemplary impedance measurement system.

In one embodiment of a micro/nano magnetic particle detection system, an impedance based sensor can be used to directly measure the impedance of a sample volume. FIG. 3 shows a block diagram of one exemplary impedance measurement system. A signal (e.g. a voltage, current or power) is generated by source 301 and measured by sense 302 (a sensor). The bandwidth of source 301 and sense 302 can be narrowband, tunable narrowband, or broadband. Block 303 is a sensing block which interacts with the samples. Block 303 can include one or several lumped inductors or circuits formed by lumped inductors together with other components, such as capacitors. In particular, parallel or series or multi-resonance LC resonators can be formed for use in block 303. The impedance of the resonator of block 303, both in amplitude and phase, can be highly dependent on an inductance value at or near a resonant frequency of the resonator.

Now, comparing the exemplary impedance measurement based sensor shown in FIG. 3 to the general embodiment described in Part II and the block diagram of FIG. 1, it can be seen that, source 301 corresponds to the one or more circuits that can generate an electrical current conducting through the EM structures (block 202, FIG. 1). Sense 302 corresponds to the one or more circuits to sense the effective inductance and/or a change in effective inductance (block 203, FIG. 1), and block 303, the sensing block which interacts with the magnetic particles, corresponds to the one or more electromagnetic (EM) structures for sensing a cell/bio-molecule sample (block 201, FIG. 1). Note that in some embodiments, block 303 can include and/or replace some of the sourcing and sensing functions of blocks 301 and 302.

Transmission Line Based Sensor

Transmission lines can be generally viewed as including a having distributed or lumped component parameters. Transmission lines have characteristics that are highly dependent on the parasitic inductance per unit length (distributed model) or the inductance per synthetic section (lumped component model). Two such characteristics of a transmission line, the characteristic impedance $Z_0$ and the delay per section $\tau$ are shown below in Eq. 1 and Eq. 2:

$$Z_0 = \sqrt{\frac{L}{C}} \quad \text{(Eq. 1)}$$

$$\tau = 2\pi\sqrt{LC} \quad \text{(Eq. 2)}$$

Figure 4:
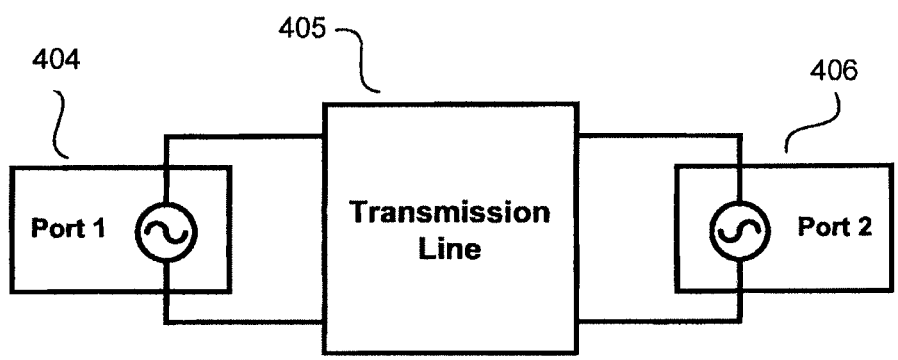
FIG. 4 shows one embodiment of a micro/nano magnetic particle detection system based on a transmission line S-parameter measurement.

One system and method to measure the change in inductance L of a transmission line is to measure the S-parameters for the transmission line under study. FIG. 4 shows one embodiment of a micro/nano magnetic particle detection system using a transmission line S-parameter based sensor structure. As can be seen in FIG. 4, circuit block 404 can function as port 1 and circuit block 406 can function as port 2 for a two-port S-parameter measurement. Block 405 functions as the sensing block which interacts with the samples. Block 405 can include a single ended transmission line, a differential transmission lines or any suitable microwave circuit having a transmission line. Suitable exemplary microwave circuits include, but are not limited to, filters, couplers, and resonators.

Now, comparing the exemplary transmission line based sensor shown in FIG. 4 to the general embodiment described in the block diagram of FIG. 1 of part II, it can be seen that Block 405, the one or more circuits that can generate an electrical current conducting through the EM structures (block 201, FIG. 1), and blocks 404 and 406 can correspond to the one or more circuits that can generate an electrical current conducting through the EM structures (block 202, FIG. 1), and the one or more circuits to sense the effective inductance and/or a change in effective inductance (block 203, FIG. 1).

Oscillator Based Sensor

Resonant structures can be made by combining inductors and capacitors and/or a microwave resonator. Resonant structures include parallel, series, and multi-mode resonators. An oscillator can be based on such resonant structures. An oscillator based on one or more resonators has an oscillation frequency. The oscillation frequency of the oscillator can be measured directly to indicate an inductance(s) (and/or the equivalent inductive part(s)) or change of inductance(s) (and/or change of the equivalent inductive part(s)) of the resonator(s), for example, using the relationship shown by Eq. 3 below.

$$\frac{\Delta f}{f} = \frac{\frac{1}{2\pi\sqrt{LC}} \cdot \left(-\frac{1}{2}\frac{\Delta L}{L}\right)}{\frac{1}{2\pi\sqrt{LC}}} = -\frac{1}{2}\frac{\Delta L}{L} \quad \text{(Eq. 3)}$$

One/multiple oscillator(s) can be made based on one/multiple resonator(s) to have one/multiple oscillation frequency/frequencies. The oscillation frequency (frequencies) can also be used to sense both/either the self/mutual inductance(s) (and/or the self/mutual inductive part(s)).

FIG. 5 shows one embodiment of a micro/nano magnetic particle detection system using an inductance sensor based on an oscillator. Block 507 includes the sensing structure whose (self/mutual) inductor (or equivalent self/mutual inductive part) will change its value when magnetic particles are present, and together with capacitors (or equivalent capacitive part), block 507 forms a resonance tank for the oscillator. Block 508, the circuitry for the oscillator core, pumps that power to the lossy tank to maintain a steady oscillation. Block 508 can include cross-coupled transistor pairs, such as have been used in negative-gm oscillator designs, or other suitable feedback structures such as are used in a Colpitts oscillator design. Block 509, a frequency counter, can be an off-the shelf type unit, such as a commercial frequency counter, or can be integrated counter such as an integrated synchronous or asynchronous adder.

Now, comparing the exemplary oscillator based sensor shown in FIG. 5 to the general embodiment described in Part II and the block diagram of FIG. 1, it can be seen that block 507 corresponds to EM structures (block 201, FIG. 1), and block 508 corresponds to the one or more circuits that can generate an electrical current conducting through the EM structures (block 202, FIG. 1) as well as the one or more circuits to sense the effective inductance and/or a change in effective inductance (block 203, FIG. 1), while counter block 509 serves as a read-out device.

FIG. 6 shows one embodiment of an improved oscillator based sensor. Note that blocks 507, 508 and 509 of FIG. 6 are equivalent to the same numbered blocks in FIG. 5. In FIG. 6, an additional mixer 612 mixes $f_{sense}$, the output of oscillator core 508 with a local oscillator frequency, such as an external frequency $f_{LO}$. The oscillation tone $f_{sense}$ is translated by mixing. The mixer 612 output includes the sum and difference frequencies: $f_{sense}+f_{LO}$, $f_{sense}-f_{LO}$. There are at least two advantages to counting the downconverted tone $f_{sense}-f_{LO}$. First, the sensitivity of the signal frequency sensed by the counter is increased from $\Delta f/f_{sense}$ to $\Delta f/(f_{sense}-f_{LO})$. Second, counting at a lower frequency of $f_{sense}-f_{LO}$, instead of a higher frequency of $f_{sense}$ makes the counter design both more reliable as well as saving electrical power (more energy efficient). Block 613 is used to filter out undesired frequencies, such as the unwanted tone $f_{sense}+f_{LO}$. Thus, it can seen that block 612 and block 613 can be used to reduce the requirements of counter 509 (by lowering the frequency to $f_{sense}-f_{LO}$) as well as to improve the resolution of the frequency read-out. Moreover, although not shown in FIG. 6, multiple mixers and multiple filters can be used for multi-step down-conversion.

Figure 7:
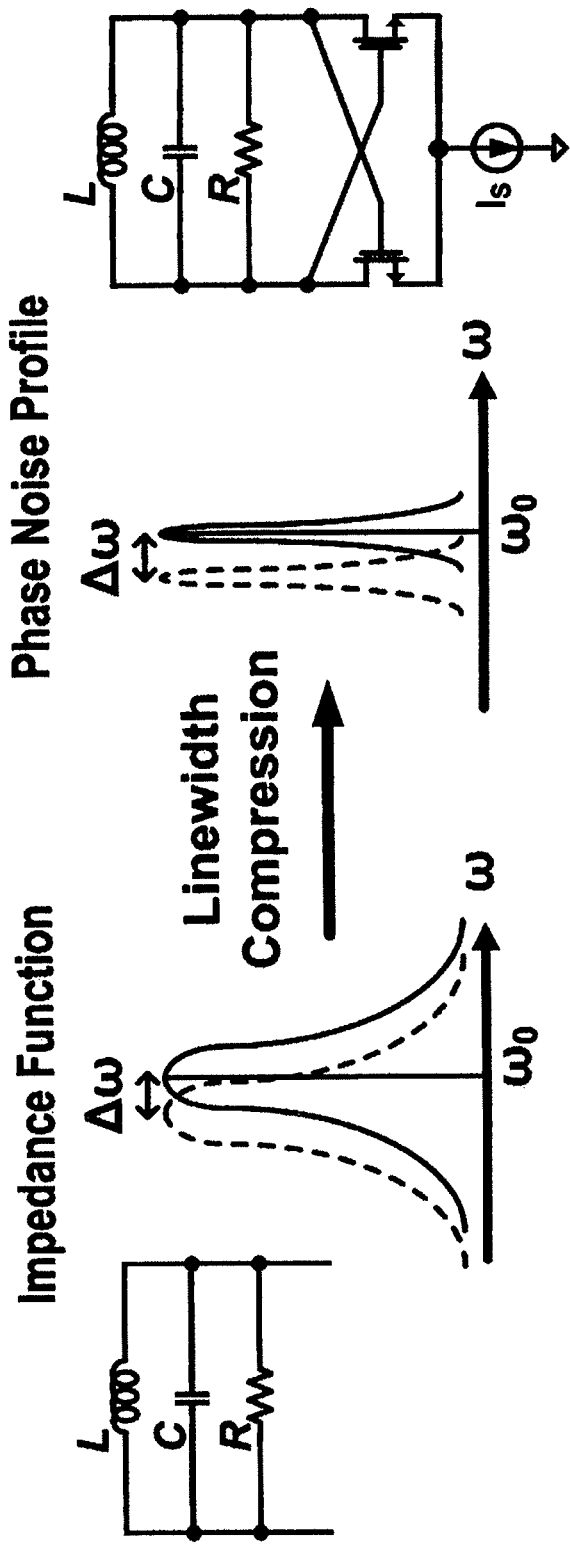
FIG. 7 shows a comparison of phase noise linewidth for an impedance based sensor (left side) compared to an oscillator based sensor (right side).

Using the impedance sensing method described above on a resonator structure, the impedance function linewidth can be fundamentally limited by the quality factor of the EM sensing structure. By contrast, when using an oscillator based measurement as the EM sensing structure, the phase noise linewidth is significantly reduced. Reduction in phase noise linewidth leads to an ultra-high sensor sensitivity which can easily detect a small frequency (inductance) change. FIG. 7 shows a comparison of phase noise linewidth for an impedance based sensor (left side) compared to an oscillator based sensor (right side).

Figure 8A:
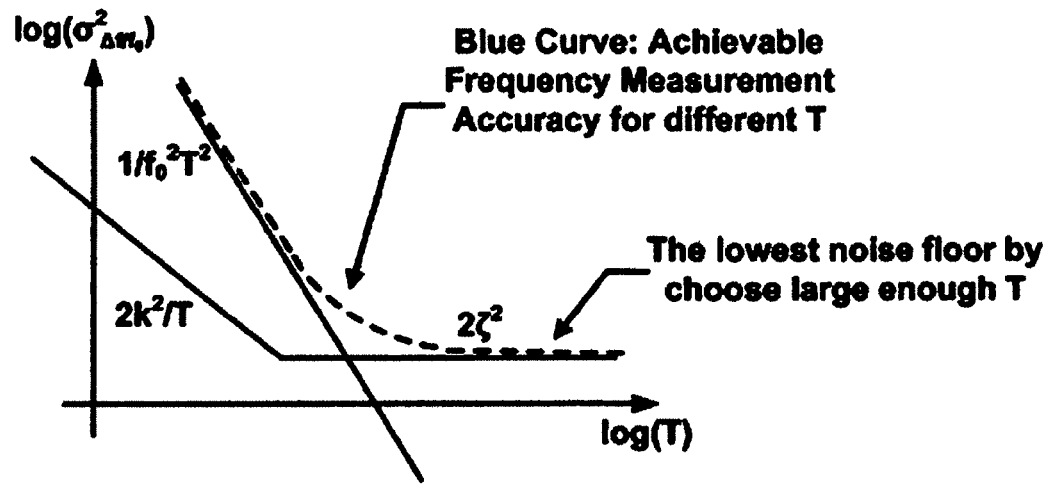
FIG. 8A shows a graph of noise floor $\sigma^2_{\Delta f/f_0}$ plotted against time (T) illustrating a different relative power between $2k^2/T$ noise and $1/f_0^2 T^2$ for an exemplary sensor system.
Figure 8B:
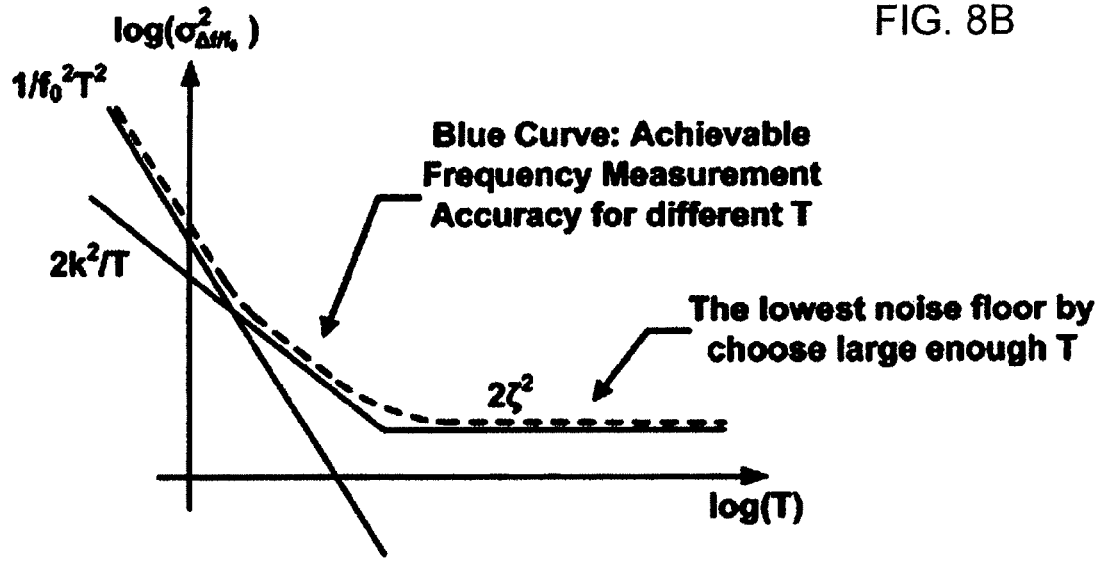
FIG. 8B shows a graph of noise floor $\sigma^2_{\Delta f/f_0}$ plotted against time (T) illustrating a different relative power between $2k^2/T$ noise and $1/f_0^2 T^2$ for another exemplary sensor system.

By averaging the measured data, such as the frequency counting results for the oscillator based measurement scheme, the sensor system can achieve an improved noise floor (i.e. improved sensitivity). Also, the sensor can achieve a high sensitivity by use of a low noise oscillator, differential sensing scheme and/or a temperature regulator structure. By choosing an appropriate measurement time T (frequency counting time) for an oscillator-based measurement implementation, a low sensor noise-floor $\sigma^2_{\Delta f/f_0}$ (i.e. improved sensor sensitivity) can be achieved. FIG. 8A shows a graph of noise floor $\sigma^2_{\Delta f/f_0}$ plotted against time (T). The $2k^2/T$ noise is from the $1/f^2$ phase noise, $1/f_0^2 T^2$ is the relative frequency counting error due to the principle of uncertainty, and the $2\zeta^2$ is due to the $1/f^3$ phase noise. Therefore, by choosing a large enough T, one can achieve the minimum achievable noise floor of $2\zeta^2$. FIG. 8A and FIG. 8B show graphs of noise floor $\sigma^2_{\Delta f/f 0}$ plotted against time (T) illustrating a different relative power between $2k^2/T$ noise and $1/f_0^2 T^2$ for two different sensor systems. Note, although not plotted here, if $1/f^n$ (n>3) exists for the oscillator phase noise, the $\sigma^2_{\Delta f/f 0}$ plot with respect to time T will start to increase after some $T_{max}$. Then the optimum sampling time T should not exceed $T_{max}$, but needs to be large enough to be in the $2\zeta^2$ flat range. For the oscillator based measurement implementation, using the same principle of differential sensing, if the $1/f^3$ phase noise can be made correlated between the sensing oscillator and the reference oscillator, by taking the frequency counting difference on the two, this $1/f^3$ phase noise can be suppressed which leads to a smaller $2\zeta^2$, and therefore a lower noise floor and a better sensor sensitivity.

Delivering Structures

Samples compatible with sensors described herein can be in any physical state, such as gas, liquid or solid, the physical state often dependent on or related to a particular application. Therefore, there are many possible implementations or configuration of a sample delivery system. Several exemplary delivery systems are described herein, each of which can be made compatible with any of the sensor designs described herein. For example, samples can be delivered via a sub-µL volume pipette controlled by fine step motor. Also, a microfluidic channel can be designed to deliver a sample in the fluid or gas state. The microfluidic channel approach also can provide an enclosed environment for the sample. In another sample delivery approach, optical tweezers can be used to deliver individual magnetic particles. Optical tweezers are well suited for deliver where a very small amount of sample needs to be delivered with high accuracy.

Part IV, Exemplary Implementations of the Sensor System

In this part, exemplary embodiments of system level sensor implementations are described.

Figure 9:
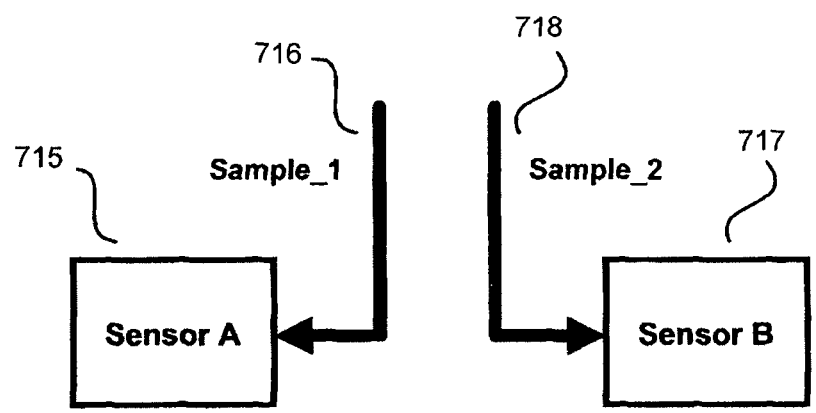
FIG. 9 shows a block diagram of one exemplary differential sensor system.

Differential Sensing System:

FIG. 9 shows a block diagram of one exemplary differential sensor system. Block 715 and block 717 of FIG. 9 represent two sensors of any suitable type, including those sensor types described above. Preferably, block 715 ("sensor A") and block 717 ("sensor B") are the same type of sensor. In general, they should share the same operation environment if needed and possible. For example the environment can include the electrical environment such as the supply, bias, and ground. Another example of the environment can be the thermal environment, such as the temperature. Also, in general, the sensors of block 715 and block 717 should be situated physically close together, preferably as close together as practical to improve matching between the two sensors for similar sensor response. Black arrows 716 and 718 represent the corresponding delivery systems of the samples to bock 715 and block 717.

In one embodiment, sensor A (block 715) can be used as a main sensor while sensor B (block 717) can be used as a reference sensor. Using a main sensor and a reference sensor, as an example, the differential sensing can be performed as follows: Structure 716 delivers the sample_1 as the target sample, while structure 18 delivers the sample_2 (or empty sample) as the control sample. The response of sensor A and sensor B can be recorded separately. Then the differences between the two sensor response signals can be calculated to produce the differential sensing results.

By having differential sensing, any common-mode noise/offset for the differential sensing sensor pair can be suppressed, as long as there is good matching between the two sensors. Exemplary non-ideal common-mode effects and offsets that can be removed by differential sensing include, by way of example, drift as a function of temperature, power supply noise, and other common-mode artifacts. Note that, in a generalized differential scheme, there can be multiple main sensors and/or multiple reference sensors. Also, the roles of main sensor and reference sensor can be interchanged. This means, for example, take sensor A as the main sensor and sensor B as the reference and do the sensing procedures described above to produce a differential signal result 1. Then, take sensor B as the main sensor and sensor A as the reference to get differential signal result 2. The two results can be processed, such as by averaging to further suppress noise and/or offsets in sensor response. The controls can also have samples with/without magnetic properties or with/without magnetic particles. The differential sensing scheme senses the difference between the target samples and the control (reference) samples.

Figure 10:
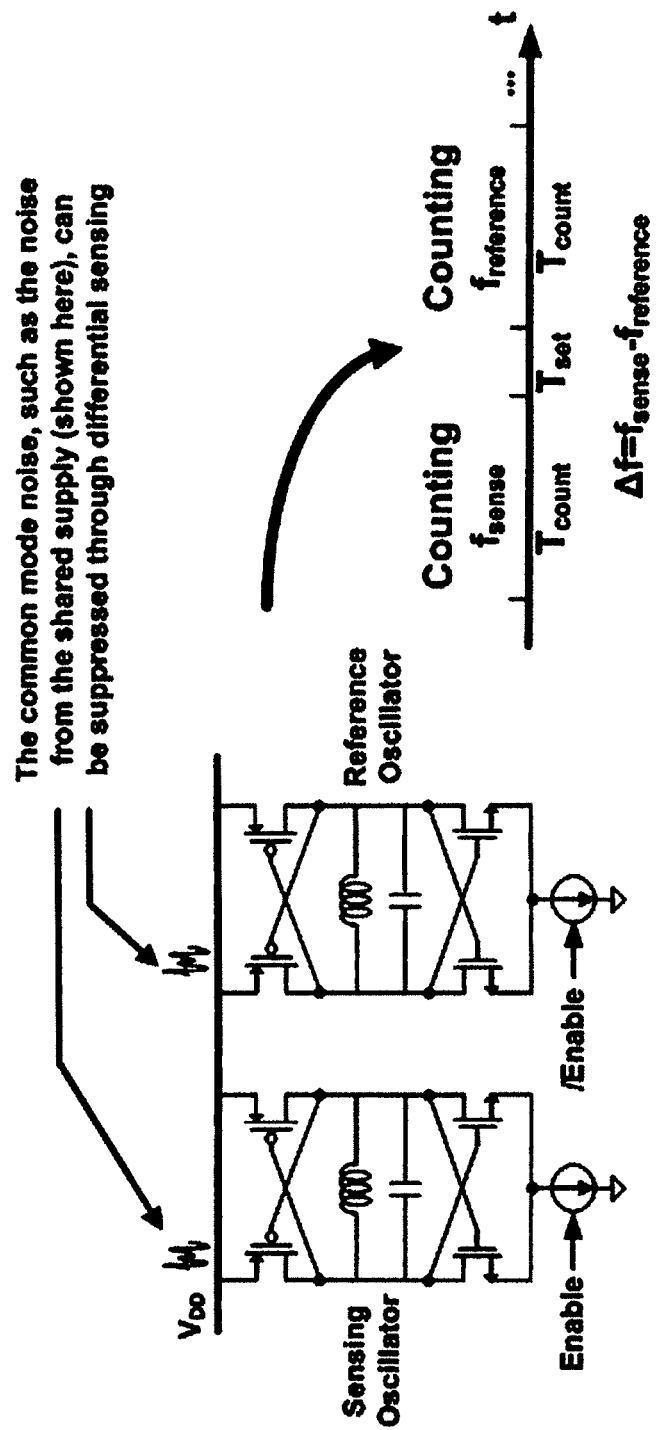
FIG. 10 shows a schematic diagram and time line illustrating how common mode noise can be suppressed through differential sensing.

FIG. 10 shows a schematic diagram of a differential sensing scheme implemented as an oscillator based measurement and a time line illustrating how common mode noise can be suppressed through differential sensing. This differential sensing method (taking the difference on the output from a sensing sensor and a reference sensor) can be used to remove the common-mode noise/drifting for the sensor system, thus yielding an overall lower noise floor for better sensor sensitivity.

Sensor Arrays

Figure 11:
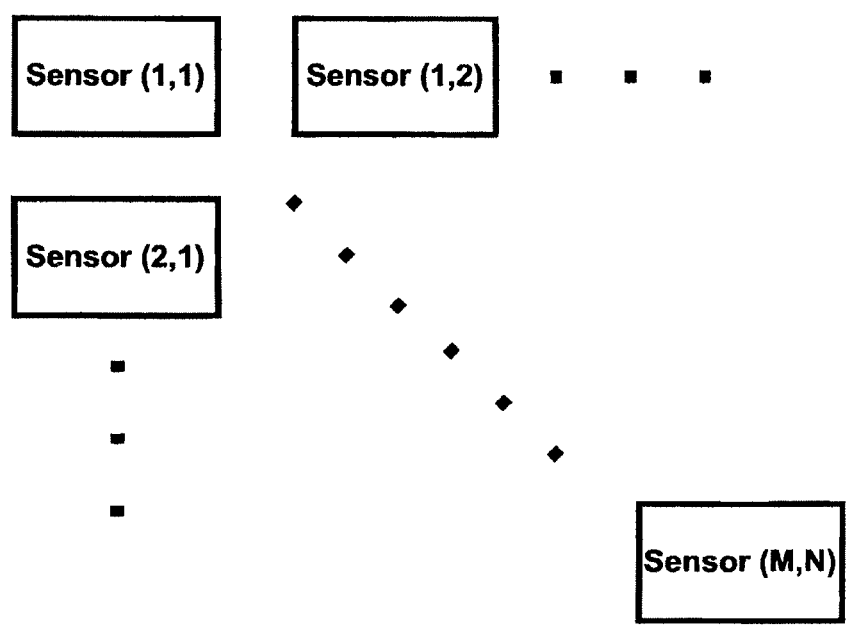
FIG. 11 shows a block diagram of a two dimensional (2D) M×N dimensional sensor array.

Two or more of any of the sensors as described above can be extended into a sensor array structure. FIG. 11 shows a block diagram of a two dimensional (2D) M×N dimensional sensor array. Each block of FIG. 11 represents a sensor. The 2D array depicted in FIG. 11 can be either reduced to a 1D array or extended to a 3D array, possibly limited only by particular fabrication and packaging technologies. A sensor array can be fabricated either on a single chip, multiple chips, in a complete discrete basis, or by any combination thereof. One advantage of a sensor array is that it can improve sensing throughput by a significant factor. The following examples illustrate two exemplary sensor array applications:

In a first example application, an incoming sample can have multiple targets labeled with magnetic particles. If Sensor$_{ij}$, for example, has a specific sensitivity to target $T_{ij}$, which means Sensor$_{ij}$ only works when $T_{ij}$ is in the solution, the M×N sensor array can detect M×N targets simultaneously. Sensor specificity can be achieved, for example, through standard affinity binding-washing procedures.

In a second example application, multiple samples can be input to a sensor array. In this exemplary case, the delivery structure is designed to access individual sensor elements independently. Therefore, with an M×N sensor array, M×N types of sample can be sensed simultaneously.

Also, using arrays having a combination of elements, some of which operate according to the first example application, and some of which operate according to the second example application, as described above, a hybrid array of the two array types can be made that can sense multiple samples with multiple targets at the same time. Thus, it can be seen that the aforementioned variations in sensor implementation are not mutually exclusive of each other. Based on a specific application, various sensor array types can be combined to form an optimized sensor system. Such array sensor systems are well suited for use in a low cost fully integrated portable battery powered lab-on-a-chip (LOC) type system.

IMPLEMENTATION EXAMPLE

Figure 12:
FIG. 12 shows an illustration of an exemplary sensor circuitry.
Figure 13:
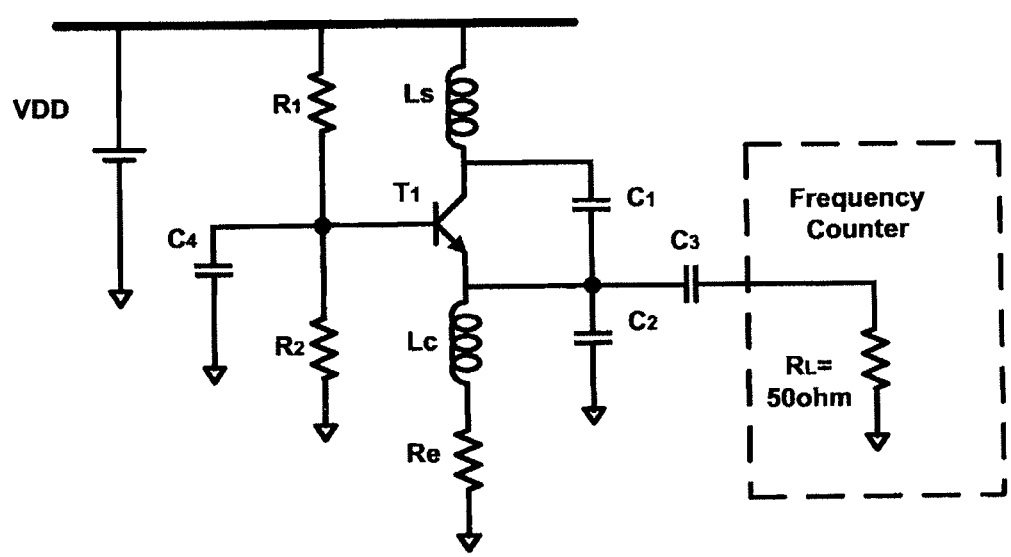
FIG. 13 shows a schematic diagram of the magnetic particle sensor based on a Colpitts LC oscillator.

Two experiments using laboratory test setups of two embodiments of a magnetic particle sensor based on the sensing mechanisms as described above are now described. An LC resonator (as described in section III above) was used as the sensor core. A low noise Colpitts oscillator was built based on a resonator, and the sensor was powered at 4.5V by 3 AA batteries. Thin-film technology was adopted to fabricate both the circuit board and the inductors. FIG. 12 shows an illustration of the sensor circuitry. FIG. 13 shows a schematic diagram of the magnetic particle sensor based on Colpitts LC oscillator. Inductor $L_s$ is used as the sensing inductor. Together with $C_1$ and $C_2$, inductor $L_s$ forms the resonator of block 507 in FIG. 5. Transistor $T_1$ forms the oscillator core as block 508 in FIG. 5. $R_1$, $R_2$, $R_e$, Lc are present for biasing purposes, while $C_3$ and $C_4$ are used for coupling and bypass purposes. An off-the shelf model 53150A HP frequency counter was used for frequency counting as block 509 in FIG. 5. The magnetic particles used in this experiment were Dyna-Beads® MyOne particles having different concentrations were used as the magnetic particles for the experiment. Dyna-Beads® Beads are available from the Invitrogen Corporation of Carlsbad, Calif. De-ionized ("DI") water was used to dilute the magnetic particle solution and to wash the surface of the sensor. Two sets of experiments were performed as described below.

Experiment 1

Figure 14:
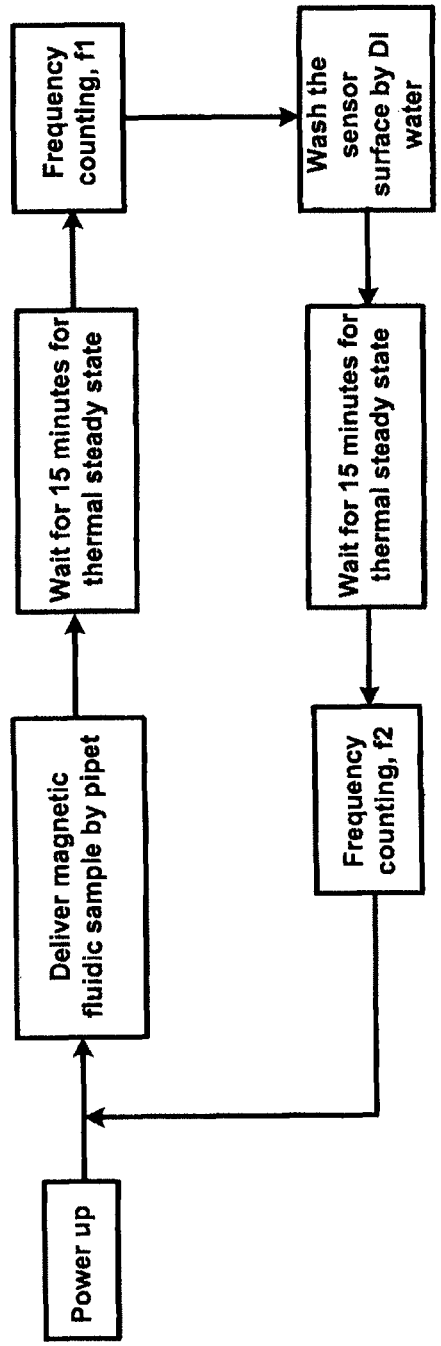
FIG. 14 shows a flowchart of the experimental procedures useful to perform experiment 1.

Experiment 1 demonstrated magnetic particle sensing without a micro-fluidic channel. The objective of this experiment was to test the functionality of the sensor in an open environment condition (without a fluidic channel). FIG. 14 shows a flowchart of the experimental procedures used to perform experiment 1. The surface temperature of the chip rises during operation of the sensor. This thermal effect, together with the open environment, induces fast vaporization of the DI water in the magnetic particle solution. Note that the baseline measurement (frequency counting on f2) and the target measurement (frequency counting on f1) together with its sample delivery can be interchanged in time. Therefore, the recorded frequency f1 and f2 corresponds to an oscillation frequency of dried beads in the inductors and an oscillation frequency with a dried inductor surface, after achieving the thermal steady-state. The sensitivity can be further defined by Eq. 4:

$$\frac{\Delta f}{f} = \frac{f_2 - f_1}{f_2} \quad \text{(Eq. 4)}$$

Figure 15A:
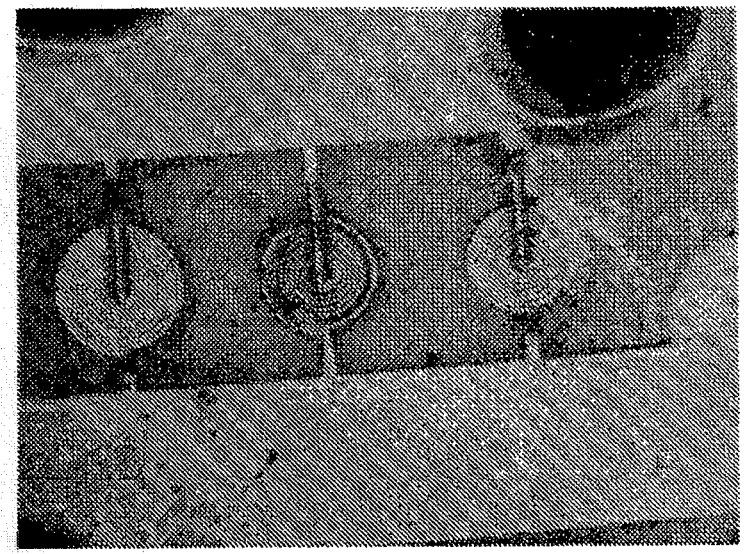
FIG. 15A shows an illustration of a sensor inductor with delivered magnetic beads.
Figure 15B:
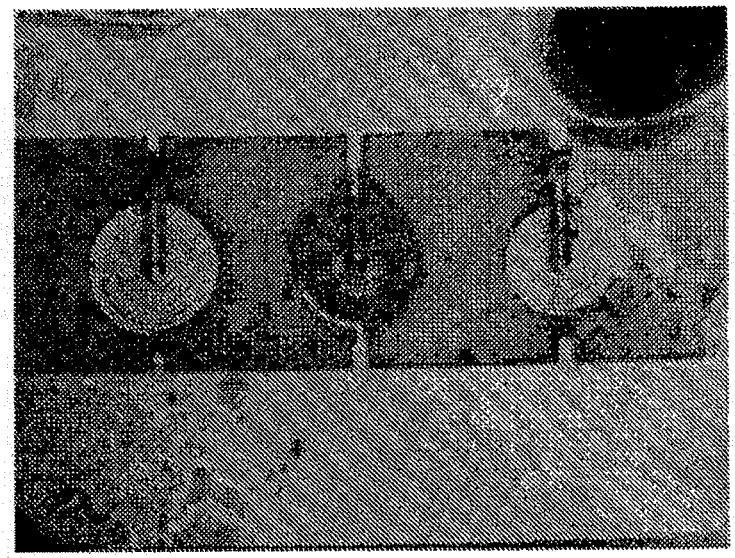
FIG. 15B shows an illustration of a sensor inductor with higher concentration of delivered magnetic beads than shown in FIG. 15A.
Figure 16:
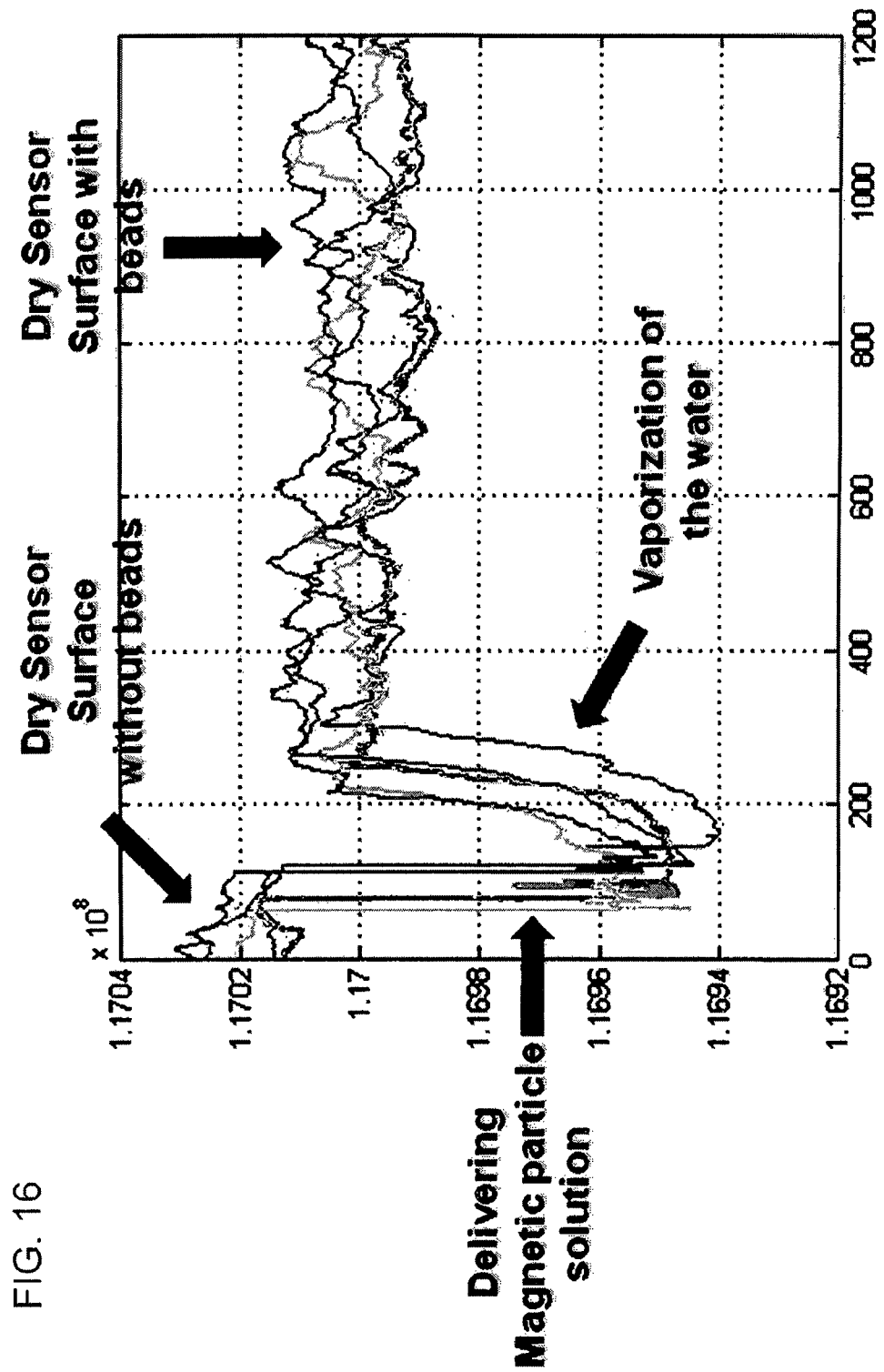
FIG. 16 is a graph showing frequency in Hz versus time in seconds for a measurement cycle.
Figure 17:
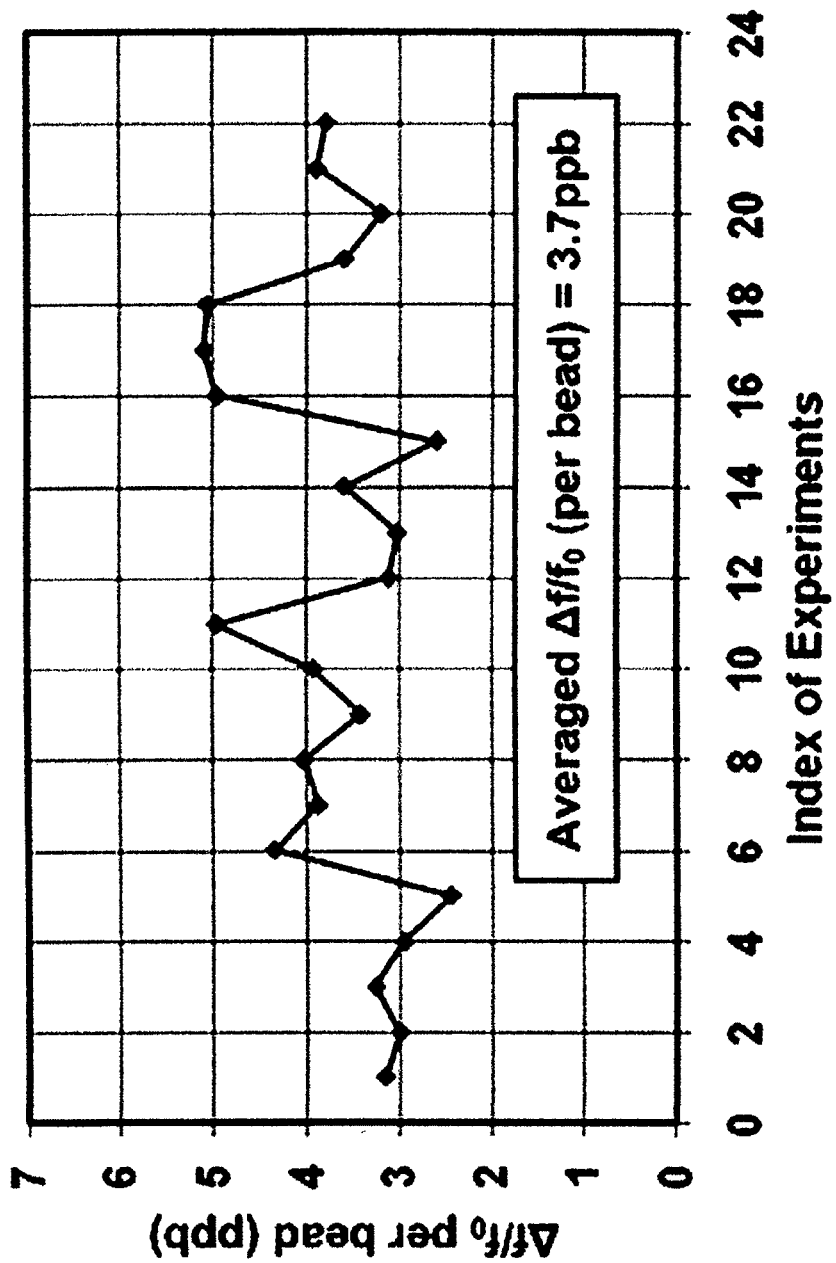
FIG. 17 is a graph showing $\Delta f/f$ per bead versus measurement number for 22 measurements.

FIG. 15A and FIG. 15B show illustrations of the sensor inductor with delivered magnetic beads, which appeared in the experiment as a brown layer (color not shown in FIG. 15A and FIG. 15B). Note that the inductor was coated with a parylene layer (thickness of about 3 μm) for electrical isolation purposes. FIG. 16 shows a graph of frequency in Hz versus time in seconds for a measurement cycle. Note that the DI water vaporized within about 200 s. FIG. 17 shows the corresponding frequency measurement results respectively plotted as Δf/f per bead versus measurement number for 22 measurements. The average Δf/f per bead is $3.7*10^{-3}$ ppm or 3.7 ppb. In comparison, a Maxwell simulation of Δf/f per bead for this setup was $4.0*10^{-3}$ ppm. Therefore, it can be seen that the measurement results were in close agreement with the simulated value.

Experiment 2

Figure 18:
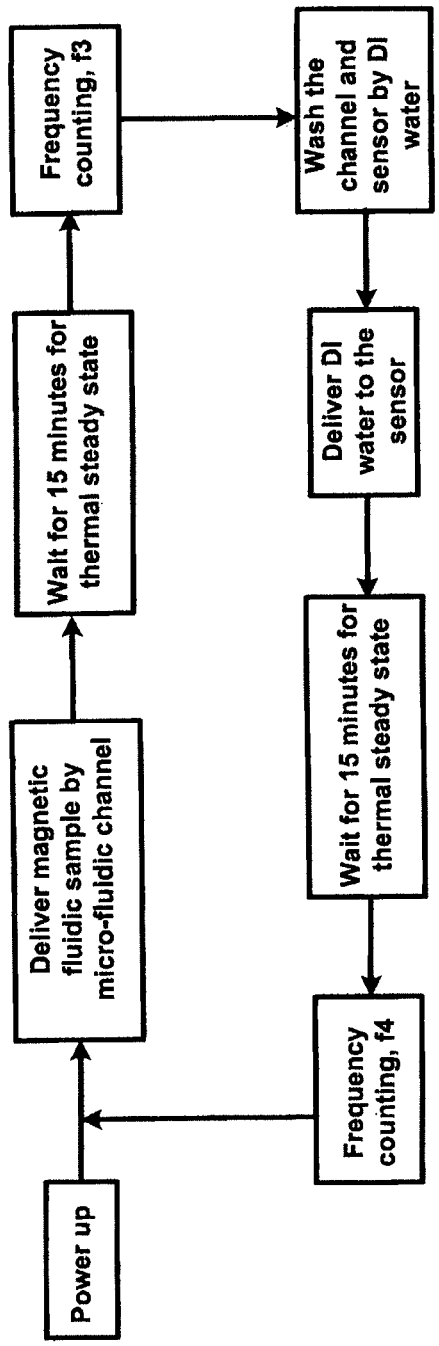
FIG. 18 shows a flowchart of experimental procedures useful to perform experiment 2.

Experiment 2 demonstrated magnetic particle sensing using a micro-fluidic channel. The objective of this experiment was to test the functionality of the bio-sensor in an enclosed aqueous condition. A microfluidic channel together with pneumatic control valves were fabricated in a polydimethylsiloxane (PDMS) material. The microfluidic channel and pneumatic control valves were used to deliver magnetic particle samples to the sensor, as well as to form a sensing chamber. The sensing chamber substantially prevented vaporization of the DI water during detection. FIG. 18 shows a flowchart of the experimental procedures used to perform experiment 2. Note that the baseline measurement (frequency counting on f4) and the target measurement (frequency counting on f3) together with its sample delivery can be interchanged in time. As in experiment 1, the surface temperature of the chip rises during operation of the sensor.

During an operational mode of the sensor, the DI water was preserved in the magnetic particle solution. Therefore, the recorded frequencies f3 and f4 correspond respectively to an oscillation frequency with the bead solution on the inductors and an oscillation frequency with only DI water. Then the sensitivity can be defined as follows:

$$\frac{\Delta f}{f} = \frac{f_4 - f_3}{f_4} \quad \text{(Eq. 5)}$$

Figure 20C:
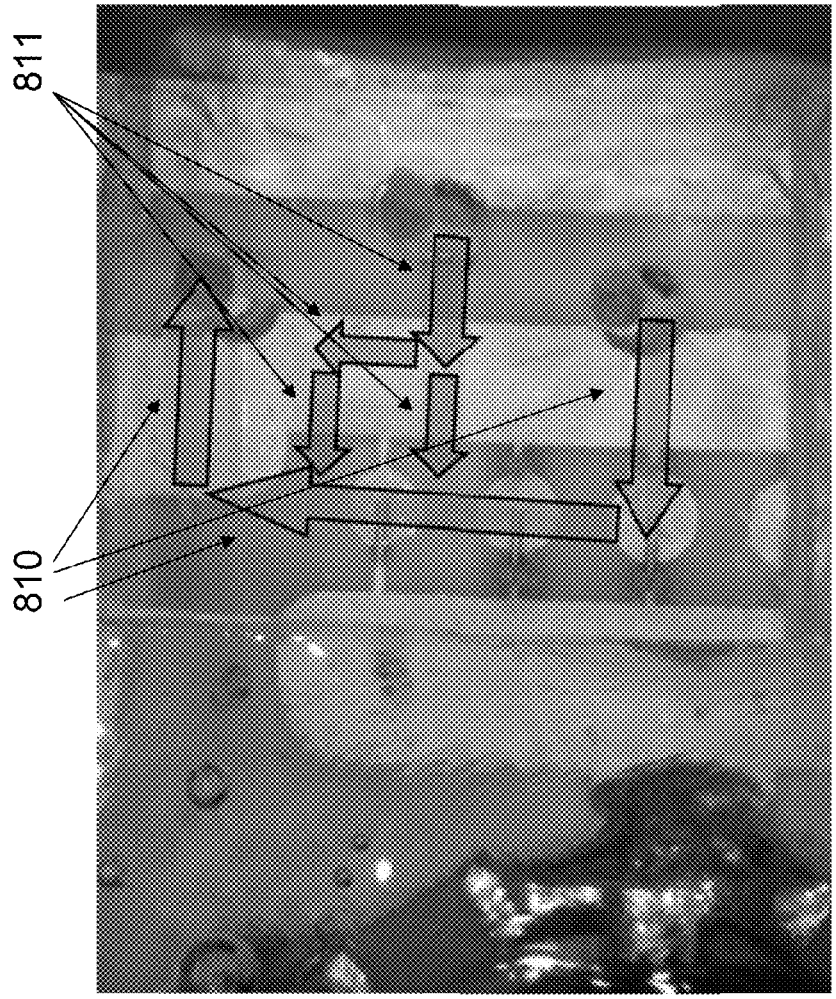
FIG. 20C is an illustration showing a more detailed view of the PDMS structure of FIG. 20A and FIG. 20B.
Figures 20A, 20B:
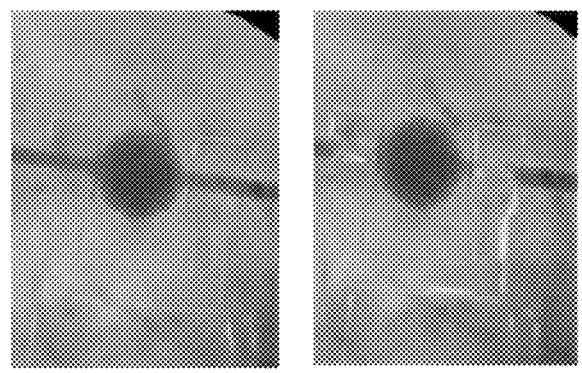
FIG. 20A is an illustration showing the channel state of the microfluidic channel when the valve is open.
FIG. 20B is an illustration showing the channel state of the microfluidic channel when the valve is closed.

FIG. 19A shows an illustration of the overall sensor setup. FIG. 19B shows an illustration emphasizing the sensor. Circle 710 highlights the PDMS structure which includes the microfluidic channel and pneumatic control valves. Circle 711 highlights a pressure sensor used to monitor the air pressure in the pneumatic control valves. FIG. 20A through FIG. 20C illustrate the operation of the microfluidic channel and the pneumatic control valves in more detail. FIG. 20A shows the channel state when the valve is open. FIG. 20B shows the channel state when the valve is closed. The solution contained a green dye in both of the aforementioned two cases. In FIG. 20C, which shows a more detailed view of the PDMS structure, arrows 810 indicate the fluidic channel and the arrows 811 indicate the control path.

Figure 21:
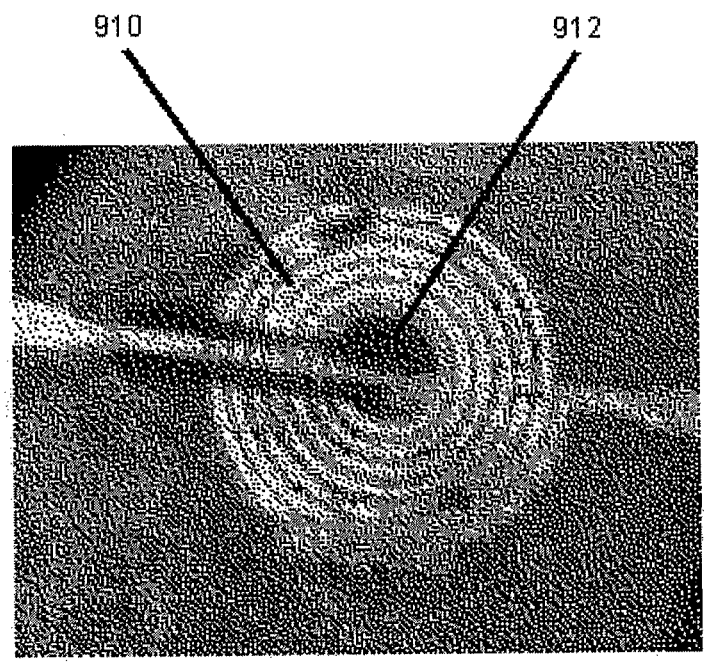
FIG. 21 shows a sensor inductor with delivered magnetic beads.

FIG. 21 shows a sensor inductor with delivered magnetic beads. Here, spiral 910 is the sensing inductor and darkened area 912 centered near the middle shows an aggregation of the magnetic beads.

Figure 22:
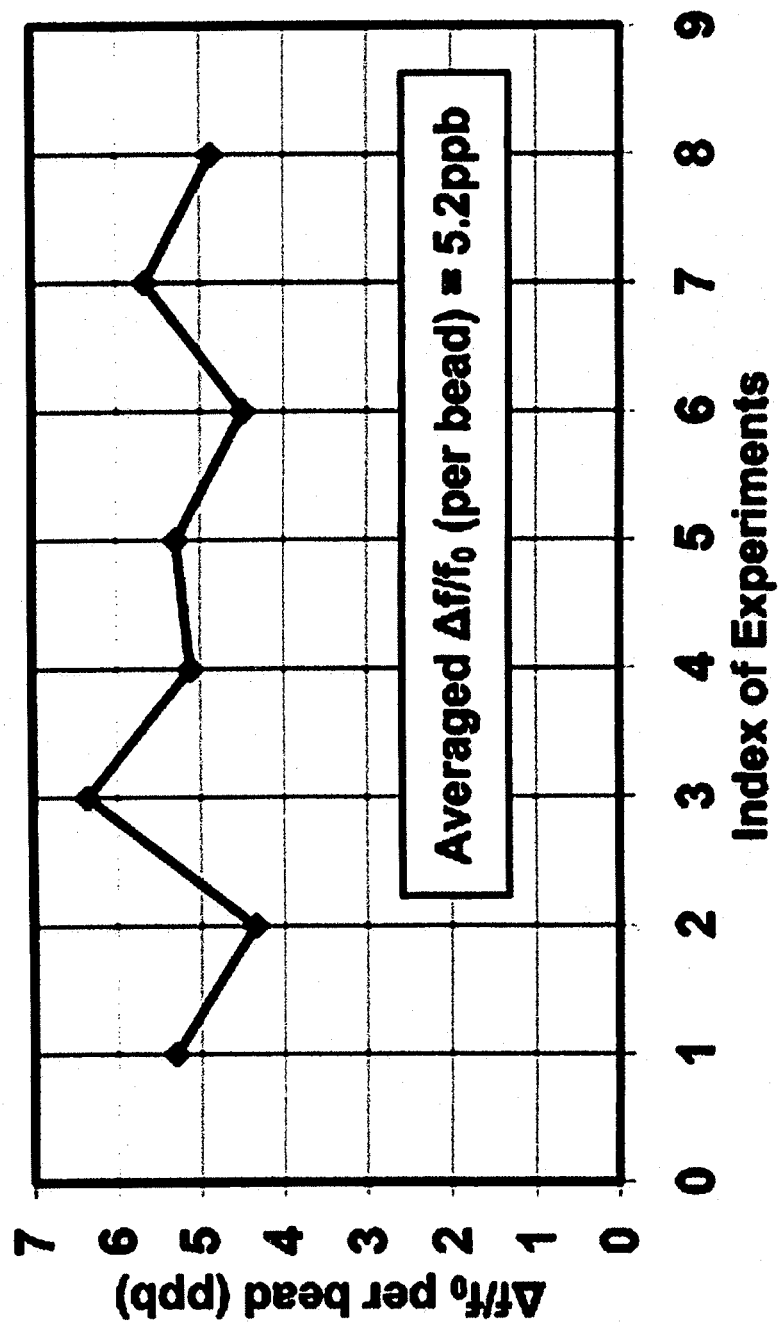
FIG. 22 shows measurement results plotted as $\Delta f/f$ per bead versus measurement number for 8 measurements.

FIG. 22 shows the measurement results plotted as Δf/f per bead versus measurement number as sensitivity data for sensing inside the microfluidic channel (for 8 measurements). The average Δf/f per bead was found to be $5.2*10^{-3}$ ppm. The simulated Δf/f per bead was calculated as $4.8*10^{-3}$ ppm. The slightly higher average Δf/f from the measurement is thought to be caused primarily by the non-equal distribution of the magnetic beads in the chamber on top of the sensing inductor. However, the two results still match relatively well.

Theoretical Discussion

Although the theoretical description given herein is thought to be correct, the operation of the systems and devices described and claimed herein does not depend upon the accuracy or validity of the theoretical description, but rather on the ability to make and use the systems and devices according to the methods and procedures described. That is, later theoretical developments that may explain the observed results on a basis different from the theory presented herein will not detract from the inventions described herein.

Theoretical Analysis of Sensing Methods

We now provide a theoretical basis for the sensing methods described herein. With a quasi-static assumption, electrical current I conduction in the sensor structure generates a magnetic field $H_{ext}$ at coordinates (x,y,z) according to Biot-Savart Law of Eq. 6:

$$\vec{H}_{ext}(x,y,z) = \frac{I}{4\pi}\oint_{C'}\frac{dl' \times \vec{R}}{R^3} \qquad \text{Eq. 6}$$

Other electromagnetic formula can be used to calculate the $H_{ext}$ at coordinates (x,y,z) if the quasi-static assumption is not valid.

Figure 23:
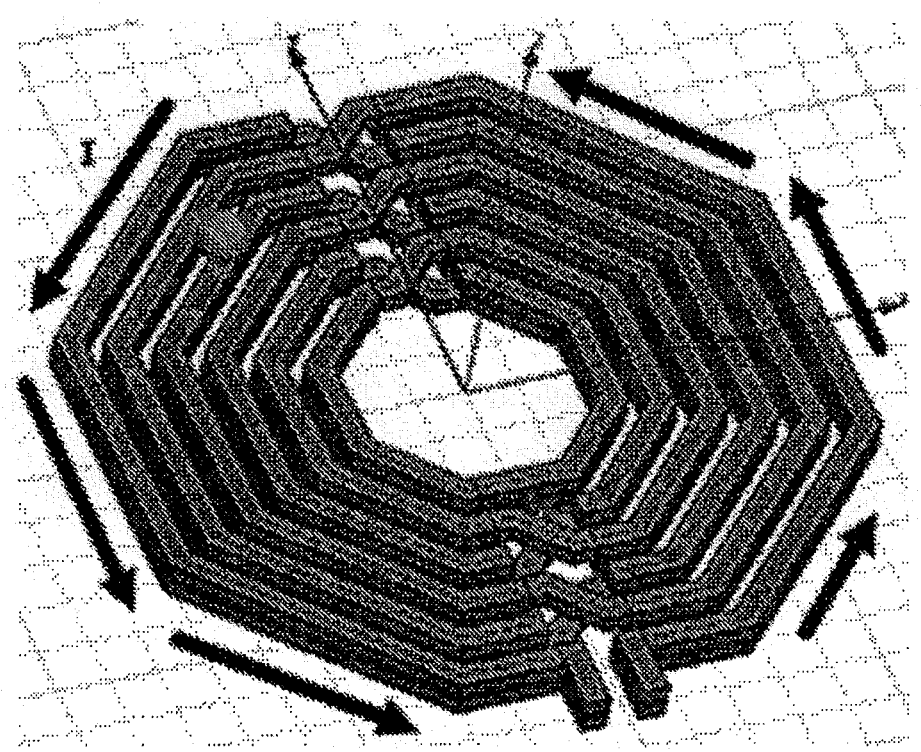
FIG. 23 shows an exemplary inductor structure that can generate a magnetic field to polarize the illustrated symbolic magnetic particle.

This magnetic field polarizes one or more magnetic particles present in the magnetic field. FIG. 23 shows an exemplary structure that generates an induced magnetization M causing a polarization of a magnetic particle. The exemplary magnetic field generating sensor structure of FIG. 23 uses a spiral 6-turn symmetric inductor. The black arrows show a current I. The sphere of FIG. 23 represents the magnetic particle.

Most commercially available magnetic particles, such as micro/nano magnetic beads, include magnetic nanoparticles dispersed in a nonmagnetic matrix. The magnetization M of such micro/nano magnetic beads can be expressed in a Langevin function form as shown in Eq. 7:

$$\vec{M}(\vec{H}) = M_{sat}\left[\coth\left(\frac{\mu_0 m_p H}{kT}\right) - \left(\frac{kT}{\mu_0 m_p H}\right)\right]\cdot\frac{\vec{H}}{H} \qquad \text{Eq. 7}$$

$\vec{H}$ is the total magnetic field inside of the bead, instead of the external excitation magnetic field $\vec{H}_{ext}$. At high temperature or low excitation magnetic fields (Curie regime), the Langevin function can be approximated and reduced to a classical formula for magnetization. This classical formula for magnetization, as shown in Eq. 8, can be used to determine an effective susceptibility ($\chi$eff) of the magnetic particle from experimental data.

$$\vec{M}(\vec{H}) \approx \frac{M_{sat}\mu_0 m_p}{3kT}\vec{H} = \chi_{eff}\vec{H} \qquad \text{Eq. 8}$$

For DynaBead® MyOne, one type of magnetic bead often used in immunoassay, the $\chi$eff is around 1.4, which by use of Eq. 9, results an effective permeability (µeff) given by:

$$\mu_{eff} = \chi_{eff} + 1 \qquad \text{Eq. 9}$$

In excitation/sensing schemes that use an open magnetic loop, demagnetization effects should also be taken into consideration. By applying the demagnetization factor $\vec{D}$, which is often in a 3×3 tensor format, the magnetic field inside of the bead and the externally applied magnetic field, can be related as shown in Eq. 10:

$$\vec{H} = \vec{H}_{ext} - \vec{D}\cdot\vec{M} \qquad \text{Eq. 10}$$

In general, the demagnetization factor $\vec{D}$ depends on the geometry of the magnetic material and the position at which the magnetic field is evaluated. With an assumption of spherical shape of the magnetic bead, and taking the magnetic field $\vec{H}$ at the center of the sphere as the average magnetic field inside of the bead, $\vec{D}$ can be reduced to the following diagonal matrix:

$$\begin{bmatrix} 1/3 & 0 & 0 \\ 0 & 1/3 & 0 \\ 0 & 0 & 1/3 \end{bmatrix}.$$

Therefore, the coordinate system can be chosen such that the X axis is aligned with the external magnetic field $\vec{H}_{ext}$. The apparent magnetic permeability µapp can be defined as $\chi$app+1. Combining Eq. 3 and Eq. 5 yields the apparent magnetic susceptibility $\chi$app as shown below in Eq. 11:

$$\vec{M}(\vec{H}_{ext}) = \frac{\chi_{eff}}{1+D_{xx}\chi_{eff}}\vec{H}_{ext} = \frac{\chi_{eff}}{1+\frac{1}{3}\chi_{eff}}\vec{H}_{ext} = \chi_{app}\vec{H}_{ext} \qquad \text{Eq. 11}$$

Eq. 11 yields two important results. First $\chi_{app}$ is always smaller than $\chi_{eff}$. Second, $\chi_{app}$ has its maximum value of 3 when $\chi_{eff}$ approaches infinity. These results show that that even if the magnetic bead is made of ferromagnetic material with high susceptibility (a factor of hundreds or thousands), $\chi_{app}$ still remains small, which leads to small magnetic signal. This is actually the fundamental reason why magnetic bead sensing is challenging.

The total magnetic energy in the space can be calculated with or without the presence of magnetic beads:

$$W_m = \frac{1}{2}\int\int\int_V \vec{H}\cdot\vec{B}dv = \qquad \text{Eq. 12}$$

$$\frac{1}{2}\int\int\int_V \mu\|H\|^2 dv = \frac{1}{2}\int\int\int_V \mu_{app}\|H_{ext}\|^2 dv$$

If the inductance value is defined to quantify the total magnetic energy in the space with a certain excitation electrical current (Eq. 13), the presence of magnetic beads can directly yield an effective inductance change ΔLeff (Eq. 14):

$$W_m = \frac{1}{2}L_{eff}I^2 = \frac{1}{2}\int\int\int_V \vec{H}\cdot\vec{B}dv \qquad \text{Eq. 13}$$

$$\Delta L_{eff}^{S21} = L_{eff}^{S2} - L_{eff}^{S1} = \frac{2(W_m^{S2} - W_m^{S1})}{I^2} \qquad \text{Eq. 14}$$

S1 and S2 above denote two states with different magnetic bead presences. Therefore, as shown above in appendix I, we have derived a way to quantitatively detect the presence of magnetic beads by effective inductance change.

Derivation of Approximate Closed-Form Solution

We now present an approximate closed-form solution to quantify the inductance change in magnetic particle sensors described above.

The intrinsic sensitivity of a magnetic particle sensor can be defined as ΔL/L per bead. Eq. 14 above showed than ΔL/L can be calculated by evaluating the total magnetic energy change in the space. However, direct application of Eq. 13 demands calculating B and H fields in space together with volume integration, which is less suitable for an analytical derivation. In the description which follows, it is shown that a close-form approximate solution can still be obtained by defining mutual inductance between the bead and the inductor coil. This analytical solution can serve as a guideline for further inductor optimization using EM software.

The setup is as follows: An arbitrary shaped inductor $L_{ind}$ conducts a DC or AC current of $I_{ind}$ placed at the origin. Assume there is only one magnetic bead existing in the space at position (x,y,z). The excitation field, $H_{ext}$, at (x,y,z) can then be calculated based on Eq. 6 above. Also, assuming the magnetic bead is small enough to homogeneously experience the $H_{ext}$ field, Eq. 11 (above) gives the magnetization inside of the bead as follows:

$$\vec{M}(\vec{H}_{ext}) = \frac{\chi_{eff}}{1 + D_{xx}\chi_{eff}} \vec{H}_{ext} \qquad \text{Eq. 15}$$

Now, approximate the magnetic particle to be a cylindrical shape with a cross-sectional area of S and height of h. The magnetic field distribution due to the induced magnetization in Eq. 15 can be viewed equivalently as generated by a volume current density $J_m$ and a surface current density $J_{ms}$ as shown in Eq. 16:

$$\vec{A} = \frac{\mu_0}{4\pi}\int_V \frac{\nabla \times \vec{M}}{R} dv + \frac{\mu_0}{4\pi}\oint_s \frac{\vec{M} \times a_n}{R} ds = \qquad \text{Eq. 16}$$

$$\frac{\mu_0}{4\pi}\int_V \frac{\vec{J}_m}{R} dv + \frac{\mu_0}{4\pi}\oint_s \frac{\vec{J}_{ms}}{R} ds$$

With the homogeneous assumption of M, the volume current density $J_m$ goes to zero, and the surface current density $J_{ms}$ is M circulating on the lateral surface of the cylinder. Therefore, the magnetic field induced by the magnetization is equivalent to a small coil conducting a current $I_{particle}$ of Mh. Therefore, we have a magnetic system with two coils, the original excitation coil $C_1$ of the inductor and the artificial coil of the magnetic particle $C_2$.

The magnetic flux increase for the excitation coil is given by $$\Delta\phi = M_{C1,C2} I_{particle} = M_{C2,C1} I_{particle}, \qquad \text{Eq. 17}$$

where $M_{C2,C1}$ is the mutual inductance from coil $C_1$ to coil $C_2$ and $M_{C1,C2}$ is the mutual inductance from coil $C_2$ to coil $C_1$. Due to the reciprocity, $M_{C2,C1}$ should equal $M_{C1,C2}$.

This mutual inductance can be directly calculated as $$M_{C1,C2} = M_{C2,C1} = \frac{\int\int \vec{B_{ext}} \cdot \vec{dS}}{I} = \frac{\|B_{ext}\| S}{I}, \qquad \text{Eq. 18}$$

Where $\vec{B}_{ext}$ is the B field generated from the excitation coil C1 and S the cross-sectional area of the magnetic particle and I is the $I_{ind}$. By considering all the factors, the relative inductance increase due to the presence of one magnetic particle can be expressed as $$\text{sensitivity} = \qquad \text{Eq. 19}$$

$$\frac{\Delta L_{eff}}{L_{ind}} = \frac{\Delta\varphi}{I_{ind} L_{ind}} = \frac{\chi_m}{(1 + D_{xx}\chi_m)\mu_0} \frac{\|B_{ext}\|^2}{I_{ind}^2 L_{ind}} \text{Volume}_{particle}$$

The result show in Eq. 19 can be extended to a case where multiple particles are present in the space, where index i indicates the $i^{th}$ magnetic particle. In Eq. 20 which follows below, it is assumed that the particles are relatively sparsely spaced so that the induced magnetization of any one particle does not affect the polarization of other particles.

$$\text{sensitivity} = \frac{\Delta L_{eff}^{S21}}{L_{ind}} = \sum_i \frac{\chi_m}{(1 + D_{xx}\chi_m)\mu_0} \frac{\|B_{ext,i}\|^2}{I_{ind}^2 L_{ind}} \text{Volume}_{particle,i} \qquad \text{Eq. 20}$$

Eq. 19 indicates that optimizing the sensitivity of an inductor can be achieved by maximizing $$\frac{\|B_{ext}\|^2}{I_{ind}^2}$$

at the particle and minimizing the self inductance $L_{ind}$. This optimization of sensitivity can also be addressed as maximizing the ratio between the increased magnetic energy due to the magnetic particle and the magnetic energy of the inductor itself.

Figure 24:
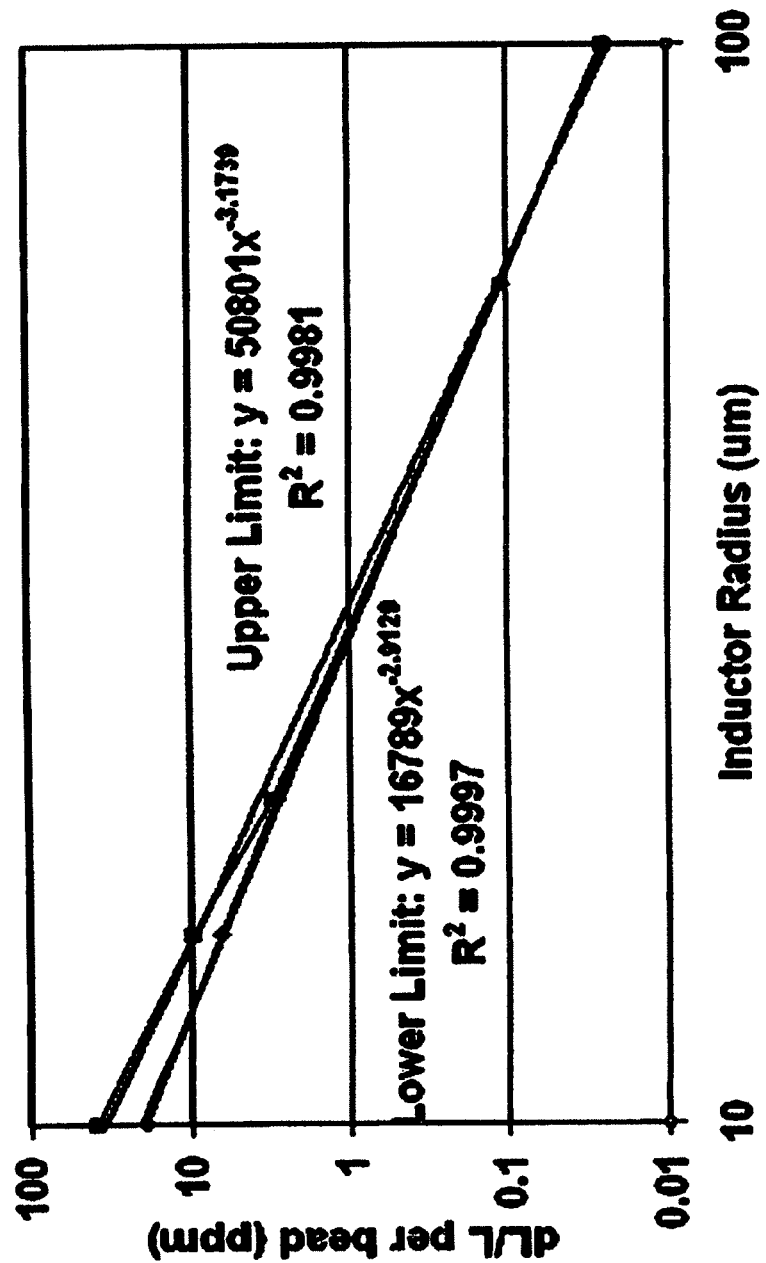
FIG. 24 is a graph showing the results of an exemplary three-dimensional (3D) EM (electromagnetic simulation).

Ansoft Maxwell V11, a 3D EM simulator (available from Ansoft, LLC, 225 West Station Square Drive, Suite 200, Pittsburgh, Pa. 15219) was used to numerically simulate the magnetic bead sensing/excitation process through calculation. The results of an exemplary simulation are shown in FIG. 24. The curve marked UL shows the upper limit of the sensitivity, while the curve marked LL shows the lower limit of the sensitivity. Two curves marked TL were used to indicate trendlines. It can be seen from the graph of FIG. 24, that the quantity $\Delta L/L$ per bead has an inverse relationship with the cube of the inductor radius, indicating that the smaller the inductor size is, the higher the sensitivity. This inverse-cubic relationship can lead to a tradeoff of sensitivity and quality factor of the inductor at a certain frequency.

While the present invention has been particularly shown and described with reference to the structure and methods disclosed herein and as illustrated in the drawings, it is not confined to the details set forth and this invention is intended to cover any modifications and changes as may come within the scope and spirit of the following claims.

What is claimed is:

1. An integrated measurement system to detect a quantity of magnetic particles in a sample, the system comprising:
   a substrate having a surface;
   first and second sample delivery structures;
   a first electromagnetic (EM) structure disposed on said surface of said substrate and configured to receive, via said first sample delivery structure, a sample comprising said magnetic particles in proximity thereof;
   an electrical current generator disposed on said surface of said substrate and electromagnetically coupled to said first EM structure, said electrical current generator configured to cause an electrical current to flow in said first EM structure;
   a sensing oscillator electrically coupled to said first EM structure, said sensing oscillator comprising a selected one of a self inductance sensor and a mutual inductance sensor, said sensing oscillator disposed on said surface of said substrate and configured to measure a selected one of an effective inductance and a change in effective inductance; and a second EM structure disposed on said surface of said substrate, wherein said second EM structure is configured to receive a control solution via said second sample delivery structure;

said integrated measurement system being configured to detect said quantity of said magnetic particles based on a differential sensing measurement that is based on a first signal associated with said first EM structure and a second signal associated with said second EM structure.

2. The measurement system of claim 1, wherein said integrated measurement system comprises a CMOS structure.

3. The measurement system of claim 1, wherein said electrical current generator comprises a quasi-static electrical current generator.

4. The measurement system of claim 1, wherein said measurement system comprises a cell/bio-molecule sensing system.

5. The measurement system of claim 1, wherein said sensing oscillator comprises a low noise oscillator.

6. The measurement system of claim 1, wherein said first sample delivery structure comprises a microfluidic delivery structure.

7. An integrated measurement system configured to detect a quantity of magnetic particles in a first sample, the system comprising:

a substrate having a surface;

a first electromagnetic (EM) structure disposed on said surface of said substrate and configured to receive a first sample comprising said magnetic particles in proximity thereof;

an electrical current generator disposed on said surface of said substrate and electromagnetically coupled to said first EM structure, said electrical current generator configured to cause an electrical current to flow in said first EM structure;

a sensing oscillator disposed on said surface of said substrate and configured to provide an indication of a selected one of an effective inductance and a change in effective inductance associated with said first EM structure;

a second EM structure disposed on said surface of said substrate and configured to receive a second sample in proximity thereof;

a reference oscillator disposed on said surface of said substrate and configured to provide an indication of a selected one of an effective inductance and a change in effective inductance associated with said second EM structure;

wherein said integrated measurement system is configured to make a differential sensing measurement to detect said quantity of said magnetic particles based on a difference between a first signal associated with said sensing oscillator and a second signal associated with said reference oscillator.

8. The measurement system of claim 7, wherein said sensing oscillator and said reference oscillator are configured to measure a difference between a first set of frequency counts of said sensing oscillator and a second set of frequency counts of said reference oscillator.

9. The measurement system of claim 7, wherein said sensing oscillator and said reference oscillator are arranged to suppress a common mode noise.

10. The measurement system of claim 7, further comprising an M×N array of EM structures disposed on said surface of said substrate, wherein each element of said array of EM structures is configured for a sensitivity to a particular type of target particle and said measurement system is configured to measure a plurality of quantities of said particular types target particles for each of a plurality of sample volumes, each sample volume of said plurality of sample volumes comprising a portion of a common sample.

11. The measurement system of claim 7, further comprising an M×N array of EM structures disposed on said surface of said substrate, wherein each element of said array of EM structures is configured to measure a quantity of target particles of a respective one of a plurality of different samples.

12. The measurement system of claim 7, further comprising a first sample delivery structure configured to provide said first sample in proximity of said first EM structure, and a second sample delivery structure configured to provide said second sample in proximity of said second EM structure.

13. The measurement system of claim 12, wherein said first sample delivery structure comprises a micro-fluidic channel.

14. The measurement system of claim 7, wherein the system is configured to disable said reference oscillator while said sensing oscillator is enabled, and to enable said reference oscillator while said sensing oscillator is disabled.

15. The measurement system of claim 7, wherein said first EM structure and said second EM structure are situated physically close together such that said first EM structure and said second EM structure experience substantially the same operation environment.

16. The measurement system of claim 7, wherein said first EM structure and said second EM structure are electrically coupled to the same supply voltage.

17. The measurement system of 7, wherein said integrated measurement system comprises a CMOS structure.

18. The measurement system of 7, wherein said electrical current generator comprises a quasi-static electrical current generator.

19. The measurement system of claim 7, wherein said measurement system comprises a cell/bio-molecule sensing system.

20. The measurement system of 7, wherein said sensing oscillator comprises a low noise oscillator.

* * * * *

UNITED STATES PATENT AND TRADEMARK OFFICE
CERTIFICATE OF CORRECTION

PATENT NO. : 9,176,206 B2  
APPLICATION NO. : 12/399603  
DATED : November 3, 2015  
INVENTOR(S) : Hua Wang et al.

It is certified that error appears in the above-identified patent and that said Letters Patent is hereby corrected as shown below:

Title page

In column 2 (page 2, item 56) at line 55, Under Other Publications, change "viahttps://" to --via https://--.

Specification

In column 13 at line 12, change "Lc" to --LC--.

In column 16 at line 21, change "that that" to --that--.

Claims

In column 20 at line 44, in Claim 17, after "system of" insert --claim--.

In column 20 at line 46, in Claim 18, after "system of" insert --claim--.

In column 20 at line 52, in Claim 20, after "system of" insert --claim--.

Signed and Sealed this  
Seventh Day of June, 2016

Michelle K. Lee  
*Director of the United States Patent and Trademark Office*